(12) United States Patent
Stewart et al.

(10) Patent No.: US 6,906,425 B2
(45) Date of Patent: Jun. 14, 2005

(54) ATTACHMENT OF SURFACE MOUNT DEVICES TO PRINTED CIRCUIT BOARDS USING A THERMOPLASTIC ADHESIVE

(75) Inventors: Steven L. Stewart, Houston, TX (US); Carlton E. Ash, Sugar Land, TX (US)

(73) Assignee: Resolution Performance Products LLC, Houston, TX (US)

( * ) Notice: Subject to any disclaimer, the term of this patent is extended or adjusted under 35 U.S.C. 154(b) by 387 days.

(21) Appl. No.: 10/091,086

(22) Filed: Mar. 5, 2002

(65) Prior Publication Data

US 2003/0170444 A1 Sep. 11, 2003

(51) Int. Cl.$^7$ .......................... H01L 23/48; H01L 23/52; H01L 29/40
(52) U.S. Cl. ..................... 257/778; 257/779; 257/780; 257/783; 257/784; 257/785; 257/786
(58) Field of Search ................................ 257/778–780, 257/783–786

(56) References Cited

U.S. PATENT DOCUMENTS

| | | | |
|---|---|---|---|
| 4,873,397 A | 10/1989 | Masujima et al. |
| 5,061,549 A | 10/1991 | Shores |
| 5,372,883 A | 12/1994 | Shores |
| 5,401,536 A | 3/1995 | Shores |
| 5,783,867 A | 7/1998 | Belke et al. |
| 5,930,889 A | 8/1999 | Klein |
| 6,037,657 A | 3/2000 | Tsurumi et al. |
| 6,084,781 A | 7/2000 | Klein |
| 6,177,728 B1 | 1/2001 | Susko et al. |
| 6,238,223 B1 | 5/2001 | Cobbley |
| 6,265,776 B1 | 7/2001 | Gilleo |
| 6,297,560 B1 | 10/2001 | Capote et al. |
| 6,774,480 B1 * | 8/2004 | Jiang .......................... 257/701 |

FOREIGN PATENT DOCUMENTS

| | | | |
|---|---|---|---|
| DE | 19822470 A | 12/1999 |
| EP | 0729182 A | 8/1996 |
| JP | 057068053 A | 4/1982 |
| JP | 03036788 A | 2/1991 |
| JP | 04249307 A | 9/1992 |
| JP | 04352491 A | 12/1992 |
| JP | 05347474 A | 12/1993 |
| JP | 08250835 A | 9/1996 |
| JP | 10335527 A | 12/1998 |

OTHER PUBLICATIONS

Adamson, S.J., "CSP and flip chip underfill," Advanced Packaging, Jun. 2001, pp. 37–44.
Johnson, Zane, "BGA Underfills" Advanced Packaging, Dec. 2001, pp. 29–33.
Alpha Microelectronic: Staystik Adhesive for Mag Heads, [internet]Retrieved on Dec. 19, 2001, URL:www.us–tech.com/april99/prods/cmp/cmp016.htm.
Center for Advanced Vehicle Electronics, "Ball Grid Array Reliability" [Internet] Retrieved on Jan. 8, 2002, URL:www.eng.auburn.edu/department/ee/cave/bgareliability.html.

(Continued)

Primary Examiner—Thien F Tran

(57) ABSTRACT

An assembly having a surface mounted electronic device mounted onto a printed circuit board and a thermoplastic adhesive applied to the surface mounted electronic device facing the printed circuit board and providing for a gap between the thermoplastic adhesive and the printed circuit board. The assembly is heated at solder reflow temperatures to at least soften the thermoplastic adhesive sufficiently to flow across the gap and provide a thermoplastic adhesive joint between the surface mounted electronic device and the printed circuit board.

47 Claims, 6 Drawing Sheets

OTHER PUBLICATIONS

Brofman, P.J., "Effect of Underfill Properties on Flip Chip Plastic BGA (FC–PBGA) Reliability," IPC, Session P–MT1/5–(1–5); Presented at Apex 2000, Mar. 14–16, 2000; Long Beach Convention Center, Long Beach, CA.

Adamson, Steven J, "When to Underfill Chip Scale Packages, Design Consideration for Portable Electronic Applications," IPC, Session P–AD2/2–(1–8); Presented at Apex 2000, Mar. 14–16, Long Beach Convention Center.

Ghaffarian, R., "Impact of CSP Assembly Underfill Reliability," IPC, Session P–AD2/3–(1–7); Presented at Apex 2000, Mar. 14–16, Long Beach Convention Center.

Yaeger, E., "Beyond Flip–Chip, Underfills Enhance CSP Reliability," Chip Scale Review, Mar. 2001, pp. 61–66.

Katze, D., "Evaluations of No–Flow Fluxing Underfills with BGA, CSP and Flip Chip on Board Assemblies," IPC, Session P–MT1/2–(1–7), Presented at Apex 2000, Long Beach Convention Center.

Gilleo, K., "Thermoplastic Die Attach Adhesive for Today's Packaging Challenges," [internet] URL: http://www.cooksonsemi.com/tech_art/staystik.htm.

Hannan, N., "Critical Aspects of Reworkable Underfills for Portable Consumer Products," 2001 Electronic Components and Technology Conference, 2001 IEEE, pp 181–187.

Chapter C: Conductive Polymers, Level 1: Introduction [internet], last updated on Sep. 7, 2000; URL:http://extra.ivf.se/ngl/C–polymerBonding/ChapterC.htm.

Kristiansen, H., "Adhesives in Electronics," Chalmers Tekniska Hogskola, SINTEF Microelectronics; Presented at International Microelectronics and Packaging Society, Flipchip Technology Workshop, Jun. 18–20, 2001.

Tong, Q., "Novel Fast Cure and Reworkable Underfill Materials," 1999 Electronic Components and Technology Conference, 0–7803–5234–3/99, 1999 IEEE, pp.

Nguyen, L., "Reworkable Flip Chip Underfill–Materials and Processes," Proc. IMAPS International Symposium on Microelectronics, pp. 707–713 (1998).

Gilleo, K., "The Great Underfill Race," [internet] URL:http://www.cooksonsemi.com/tech_art/polysolder.htm.

Gilleo, K., "Wafer–Level Flux Underfill: Underflip," Presented at Apex 2000, Mar. 14–16, 2000; Long Beach Convention Center; Session P–MT1/4–(1–5).

Thorpe, R., "Low Cost Flip Chip Processing Utilizing No Flow Underfill Materials,"Presented at Apex 2000, Mar. 14–16, 2000; Long Beach Convention Center; Session P–AP3/3–(1–8).

Hackett, S., "A No–flow Underfill With Excellent Reliability Performance," IMAPS Flip Chip 2001 Austin, Texas Jun. 18–19, 2001.

Suzuki, O., Research on the Development of Advanced Non Conductive Paste (ANCP), Imaps Conference on Flip Chip Technology in Austin, Texas; Jun. 18–19, 2001.

PRC Research Project Summaries, Flip Chip Assembly Thrust, [internet] Obtained Oct. 31, 2001, URL: www.ee-.gatech.edu/research/PRC/research/projsummary/asm.htm.

Emerson, J., "Techniques for Determining the Flow Properties of Underfill Materials," 1999 electronic Components and Technology Conference, 0–7803–5234–3/99.

Fine, P., "Flip Chip Underfill Flow Characteristics and Prediction," 1999 Electronic Components and Technology Conference, 0–7803–5234–3/99.

The National Technology Roadmap for Electronic Interconnections, Part C–Section I–Package Style and Physical Attributes, Roadmap 2000/2001; C1–6.

The National Technology Roadmap for Electronic Interconnections, Part D–Section 1–Organic Interconnecting Structures, Roadmap 2000/2001; D1–15.

Goyal, S, "Role of Shock Response Spectrum in Electronic Product Suspension Design," The International Journal of Microcircuits and Electronic Packaging, vol. 23, No. 2, Second Quarter 2000, pp 182–190.

Yamaji, Y., "A proposal: the Assessing Method of the CSP's Mechanical Reliability on Board," The International Journal of Microcircuits and Electronic Packaging, vol. 23, No. 1, First Quarter 2000, pp 138–145.

Goyal, S, "Methods for Realistic Drop–Testing," The International Journal of Microcircuits and Electronic Packaging, vol. 23, No. 1, First Quarter 2000, pp. 45–52.

Xu, K., "A General Purpose Adhesive for Microelectronic Devices," The International Journal of Microcircuits and Electronic Packaging, vol. 23, No. 1, First Quarter 2000, pp. 78–84.

Seppala, A, "Flip Chip Joining on GR–4 Substrate Using ACFs," The International Journal of Microcircuits and Electronic Packaging, vol. 24, No. 2, Second Quarter 2001, pp. 148–159.

Swirbel, T., "Chip Scale Package and Multichip Module Impact on Substrate Requirements for Portable Wireless Products," The International Journal of Microcircuits and Electronic Packaging, vol. 23, No. 3, Third Quarter 2000, pp. 320–324.

Gilleo, K., "Thermoplastic Adhesives—The Attachment Solution For Multichip Modules," [internet] URL: http://www.cooksonsemi.com/tech_art/staystik.htm.

Gilleo, K., "New Generation Underfills Power The $2^{nd}$ Flip Chip Revolution," [internet] URL: http://www.cooksonsemi.com/tech_art/polysolder.htm.

Hung,S.C., "Board Level Reliability of Chip Scale Packages," The International Journal of Microcircuits and Electronic Packaging, vol. 23, No. 1, First Quarter 2000, pp. 118–130.

Gilleo, K., "Transforming Flip Chip into CSP with Reworkable Wafer–Level Underfill," [internet] URL: http://www.cooksonsemi.com/tech_art/staychip.htm.

Gilleo, K, "The Ultimate Flip Chip–Integrated Flux/Underfill," [internet] http://www.cooksonsemi.com/tech_art/staychip.htm.

Preveti, M., "No Flow Underfill Reliability is Here," [internet] URL:http://www.cooksonsemi.com/tech_art/staychip.htm.

Gilleo, K., "The Chemistry & Physics of Underfill," [internet] URL: http://www.cooksonsemi.com/tech_art/staychip.htm.

Harper, P., "Thermoplastic Die Attach For Hermetic Packaging," The International Journal of Microelectronics and Electronic Packaging, vol. 17, No. 4, Fourth Quarter, 1994, pp.

Gilleo, K., "Molded Underfill for Flip Chip in Package," [internet]Jun., 2000; URL: http://www.cooksonsemi.com/tech_art/staychip.htm.

* cited by examiner

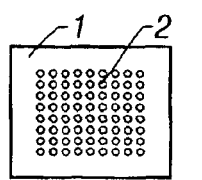 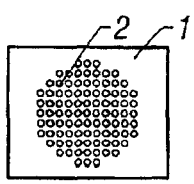 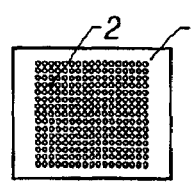 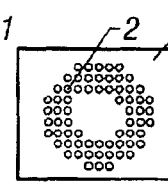 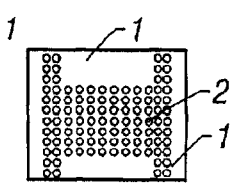
FIG. 4A   FIG. 4B   FIG. 4C   FIG. 4D   FIG. 4E
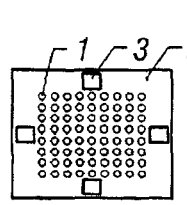 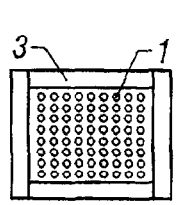 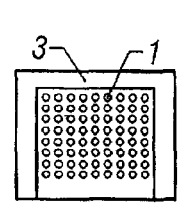 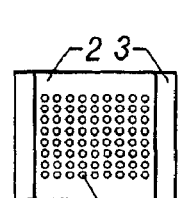 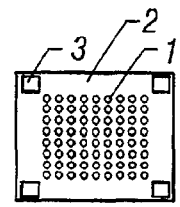
FIG. 5A   FIG. 5B   FIG. 5C   FIG. 5D   FIG. 5E

ATTACHMENT OF SURFACE MOUNT DEVICES TO PRINTED CIRCUIT BOARDS USING A THERMOPLASTIC ADHESIVE

FIELD OF THE INVENTION

The invention relates to a process and material for adhering surface mounted electronic device to printed circuit boards, and more particularly to a process for adhering surface mounted electronic device to printed circuit board using a thermoplastic adhesive and thermoplastic adhesive compositions.

BACKGROUND OF THE INVENTION

In recent years, the demands for the miniaturization of electronic instruments, higher frequency processing speeds, weight savings, and reduction in manufacturing costs are driving down the solder bump density and requiring an increase on the number of solder bumps per package. The industry has progressed from the use of through hole pin technology in which the pin leads on the semiconductor package are physically inserted through corresponding holes in the printed circuit board (PCB), to surface mount technology (SMT) to improve both manufacturing costs and density.

There exist numerous techniques for mounting semiconductor packages to PCB's using SMT. Currently, the popular technique is to mount leadless surface devices, and in particular, the ball grid array (BGA) type semiconductor packages in which solder ball leads on the substrate of an encapsulated semiconductor package contact with the landing pads on a PCB. The BGA is distinguished by the presence of solder bumps on the underside of the encapsulated semiconductor package. BGA's offer the advantage of providing higher chip density, reliability, and efficiency. With continual improvements in the miniaturization of BGA's, the size of the die has approached that of the encapsulant in a flip chip BGA. These particular BGA packages are commonly referred to as chip scale packages (CSP).

BGAs are generally manufactured by mounting a bare integrated circuit (IC), also known as a die or silicon die, on a double sided connecting substrate for supporting the IC, and establishing a connection between the leads on the IC and contacts on the connecting substrate. In one configuration, the connection is established by connecting wires running from terminals on the periphery of the IC, or from terminals on the top surface of the IC, to the external terminals on a wired substrate. The IC is generally adhesively adhered to the connecting substrate using a thermoset or thermoplastic adhesive. FIG. 1 illustrates such configuration, known as a transfer molding chip or a BGA encapsulated package. The IC 1 is adhesively mounted with a staking adhesive 2 to the connecting substrate 3 having solder bumps 6 on its bottom side. The IC is connected by wires 4 welded from the IC 1 to contacts on the connecting substrate 3. The wiring, IC, and staking adhesive are encapsulated with an encapsulating resin 5, typically a thermosetting epoxy resin. The staking adhesive is also typically a thermosetting filled epoxy resin which is heat cured.

In a flip chip design, however, solder bumps instead of wires are formed on one side of the IC, the IC is flipped over and laid up onto the corresponding solder bumps or other contacts on the connecting substrate, followed by solder reflowing the solder bumps on the IC and the contacts on the connecting substrate to make an electrical connection. In the flip chip design, the gap between the IC and connecting substrate is often underfilled with an epoxy resin. The structure is illustrated in FIG. 2. Underfill is generally accomplished by mounting the IC 1 facedown so that solder balls 7 are in alignment with the contacts on the connecting substrate 2 having solder balls 6 along its bottom surface, placing the assembly into a mold with an underfill resin, and forcing the underfill resin 3 to flow into the gap 4 between the IC and the connecting substrate 5 and around the periphery of the of the IC to provide a good seal. The underfill resin is also generally a thermosetting epoxy resin. The structure is then encapsulated 5 with an epoxy resin or other resin encapsulant to form a semiconductor package known as a BGA.

There exist a wide variety of BGA configurations. Common BGA packages include flip chip BGA, ceramic (CBGA), plastic (PBGA), and micro-BGA (MBGA), also known as chip size packages (CSP). A CSP is a type of BGA in which the size of the IC approaches that of the connecting substrate. Each structure has its own advantages and attributes.

BGAs are usually attached to rigid planar PCB's made of FR-4 glass/epoxy composites. In some applications, the BGA's may be attached to flexible PCBs made of polyimide, polyester, or other like materials. BGA packages are mounted onto a PCB by reflow solder processing techniques. BGAs have a grid or array of solder bumps acting as the terminals arranged on the bottom side of the chip package to establish the electrical connection with the landing pads on the PCB. A solder containing lead in the form of a paste or other form in a silk screen is set between the solder bumps on the BGA and the etched terminals or pads on the PCB. The BGA is laid up cold on the solder paste and subsequently aligned with the landing pad on the PCB. The assembly is then passed through an oven and heated, usually by convection, within a time-temperature profile to enable the reflow of the solder. Typical peak solder reflow temperatures range from 200° C. to 260° C. In another method, chip packages may also be surface mounted by placing a small amount of solder flux on the solder bumps themselves. The array is precisely positioned on the PCB landing pads, and the assembly is then heated under an appropriate time-temperature profile to establish the connection.

Many applications containing printed circuit boards require the ability of the printed circuit board to flex, resist vibration, and/or resist impacts. For example, portable electronic devices such as phones, pagers, lap top computers, calculators, digital audio players, cameras, and gaming devices contain PCB's on which are mounted chip packages. These hand held devices are subject to impact by drops or vibration, leading to the failure of the chip package/PCB solder joint. These impacts break the solder joints between the connecting substrate and the landing pads on a printed circuit board. In some cases, a significant number of the solder joints in the solder array of the BGA may separate from the PCB, or the entire BGA may pop off the PCB if the force of the impact or vibration is sufficient.

Adhesion of the chip package to the PCB is becoming more problematic as the technology continues to miniaturize the chip packages, the interconnect density increases, the solder ball density decreases thereby reducing the size of each solder ball and joint, and the gap between the chip package and the PCB continues to decrease. In recent years the size (height and width) of the solder bumps and the spacing between the bumps in the array of the BGA has become much smaller. While there is variance among the types of chip packages, generally bump heights may range from less than one to several millimeters. Commonly used BGA's have centerline pitches (pitches) ranging from 0.5 mm×0.5 mm (or 19.7 mil) in MBGA's and CSP, to 1.50 mm×1.50 mm (or 59 mil) in PBGA and CBGA. The centerline pitch is the distance between the bumps in an array.

Since the contact area between the solder bumps and the landing pads on the PCB has become much smaller, the gap between the chip package and the PCB has also become much smaller. Moreover, the interconnect density is rapidly increasing. The interconnect density in the 1980's was generally on a 100 mil pitch with center-to center spacing of 0.100" (about 2.5 mm) [1 mm=39.4 mils], yielding an interconnect density of 100 contacts per square inch. In the 1990's, the physical dimensions of the contacts have become smaller and the distance between contacts reduced to 10 mils and often less. Thus the interconnect density has increased to 10,000 or more per square inch.

Several solutions to address the issue of solder joint failure have been proposed. One proposed solution was to add more solder balls to assist with the adhesion of the chip package to the PCB. However, the vibration and drop resistance is not sufficient and the electrically connected solder joints fail. The addition of metal grids and springs to act as shock absorbers has been proposed, but this mechanical solution requires additional space by increasing gap distance and chip size. Another proposal which was placed into commercial practice was to underfill the gap between the connecting substrate and the printed circuit board.

FIG. 3 illustrates a typical configuration of a flip chip BGA mounted on a printed circuit board and underfilled with a resin. The solder bumps 8 on a BGA 1, comprised of an IC 2 connected to the contacts on a connecting substrate 3 through solder bumps 4 and underfilled with a thermosetting resin 5 wherein the IC 2 is encapsulated with an thermosetting resin 6, are mounted on and aligned with the landing pads 10 on a printed circuit board 7, the assembly is solder reflowed, and the gap between the connecting substrate and the printed circuit board is underfilled with a thermosetting epoxy resin 9 to provide adhesion between the board 7 and the connecting substrate 3. When a gap is underfilled, the resin flows across the entire bottom surface of the connecting substrate and between the solder joints.

However, the use of underfills has not provided a complete and economical solution to joint failure in a market which demands ever increasing performance at lower costs. The smaller gap widths and the increased interconnect density have begun to exceed the limitations of underfill technology as a practical means for securing the surface mounted electronic device to the printed circuit board. Using capillary action or forced injection of underfill resins into such small gaps (which today can be as small as 7 mils) containing such high interconnect densities without damaging any of the solder joints while simultaneously providing resistance to the impacts of drops has stretched the limits of underfill technology. While the use of underfill technology has aided in the reduction of solder joint failures in drops for certain applications, the gap height reduction, increase in interconnect density, and decrease in solder ball density have necessitated a search for a new solution which improves the adhesion in new surface mount technologies.

In addition to the problem of adhesion in new surface mounted technologies, the use of underfills introduced a costly and complex manufacturing step due to the specific material design need to achieve performance demands and the manufacturing cycle time. While a wide variety of underfill techniques are used commercially, and other techniques have been proposed, a common manufacturing technique for underfilling the gap between the chip package/PCB gap comprises a first step for heating the resin and heating the board, a second step for dispensing the resin as by injecting the resin or allowing the resin to flow by capillary action under the chip package and into the gap and around the chip package to provide a seal, followed by curing the resin for a period of about 15 minutes to 45 minutes. The underfill technology also requires dispensing the resin uniformly throughout both surfaces of the gap, and throughout the whole of the surfaces, thus requiring the use of large amounts of material in the process. Specialized equipment is needed to reliably and accurately place assembly and apply the required amount of resin. The underfill must be designed to have a viscosity which enables it to wet all surfaces and flow freely into the gap. Moreover, once hardened, most thermosetting resin bonds are permanent, so rework or repair of faulty chips or solder joints becomes impractical.

Accordingly, it would be desirable to provide a process and material which reduces the surface mounted electronic device/printed circuit board assembly manufacturing cycle time. It would also be desirable to provide a process and material which adheres well to the connecting substrate and the printed circuit board in small gaps without risking damage to solder joints, while providing good impact resistance to the assembly. It would also advantageous to provide an assembly which, if once desires, allows for convenient reworking or repair of faulty chips.

SUMMARY OF THE INVENTION

There is now provided a surface mounted electronic device and an assembly which solves the above mentioned problems, as well as a method for the manufacture thereof and their compositions of matter.

In one embodiment, there is provided a sheet of multiple surface mount electronic devices forming rows and columns of solder ball arrays and solid or semi-solid thermoplastic adhesive adhered to available surfaces between said rows or columns or both.

In another embodiment, there is provided a process for singulating surface mounted electronic devices from a sheet of surface mounted electronic devices forming rows and columns of solder ball arrays and solid or semi-solid thermoplastic adhesive adhered to available surfaces between said rows or columns or both, comprising cutting each surface mounted electronic device from the sheet along the length of the thermoplastic adhesive.

In yet another embodiment, there is provided a solid or semi-solid thermoplastic adhesive pre-form having a shape corresponding to a pre-selected pattern on available surfaces of a sheet of ball grid array integrated circuits.

In a further embodiment, there is provided an assembly comprising a surface mounted electronic device and a printed circuit board defining an assembly gap width between the device and the printed circuit board before solder reflow, said surface mounted electronic device comprising an organic connecting substrate having terminal leads or solder bumps and having a bottom surface facing the printed circuit board, said bottom surface comprising a semi-solid or solid thermoplastic adhesive attached to a portion of the bottom surface, wherein the terminal leads or solder bumps are mounted on landing pads on the printed circuit board, and the thermoplastic adhesive has a height which is less than the assembly gap width to provide a second gap between the thermoplastic adhesive and the printed circuit board.

In yet another aspect of the invention, there is provided a process for adhering a printed circuit board having landing pads to a surface mount electronic device comprising an organic connecting substrate having an upper surface and a bottom surface, and solder bumps disposed on a bottom surface or having terminal leads disposed on the connecting substrate, comprising:

a) attaching a thermoplastic adhesive onto a portion of the bottom surface of the connecting substrate;

b) mounting the electronic device onto a printed circuit board to form an assembly in which the terminal leads or solder bumps are aligned with corresponding landing pads on the printed circuit board and the adhesive faces the printed circuit board and wherein a gap is provided between the thermoplastic adhesive and the printed circuit board; and c) heating the assembly under solder reflow conditions effective to provide an adhesive bond between the organic bottom surface of the electronic device and the printed circuit board and effective to provide a solder joint between the connecting substrate and the landing pads on the printed circuit board.

In another process embodiment, there is provided a process for adhering a printed circuit board comprising landing pads to a surface mount electronic device comprising a connecting substrate having a bottom surface with leads, said process comprising adhering a thermoplastic adhesive onto a portion of said bottom surface, mounting the electronic device onto a printed circuit board to form an assembly in which the leads on said bottom surface are aligned with corresponding landing pads and the thermoplastic adhesive faces the printed circuit board forming a gap between the thermoplastic adhesive and the printed circuit board, followed by heating the assembly under solder reflow conditions effective to provide an adhesive joint between said bottom surface and the printed circuit board, wherein the thermoplastic adhesive comprises a functionalized polyolefin.

There is also provided a process for adhering a printed circuit board comprising landing pads to a surface mount electronic device comprising a connecting substrate having a bottom surface with leads, said process comprising adhering a thermoplastic adhesive onto a portion of said bottom surface, mounting the electronic device onto a printed circuit board to form an assembly in which the leads on said bottom surface are aligned with corresponding landing pads and the thermoplastic adhesive faces the printed circuit board forming a gap between the thermoplastic adhesive and the printed circuit board, followed by heating the assembly under solder reflow conditions effective to provide an adhesive joint between said bottom surface and the printed circuit board, wherein the thermoplastic adhesive comprises a polyamide resin in an amount of at least 10 wt. %.

In yet another embodiment, there is provided a process for adhering a printed circuit board comprising landing pads to a surface mount electronic device comprising a connecting substrate having a bottom surface with leads, said process comprising adhering a thermoplastic adhesive onto a portion of said bottom surface, mounting the electronic device onto a printed circuit board to form an assembly in which the leads on said bottom surface are aligned with corresponding landing pads and the thermoplastic adhesive faces the printed circuit board forming a gap between the thermoplastic adhesive and the printed circuit board, followed by heating the assembly under solder reflow conditions effective to provide an adhesive joint between said bottom surface and the printed circuit board, wherein the thermoplastic adhesive comprises:

(A) from 5% to 98% by weight of a functionalized polyolefin, and (B) from 2% to 95% by weight of a polyamide compound.

BRIEF DESCRIPTION OF THE DRAWINGS

FIGS. 4A, 4B, 4C, 4D, and 4E are bottom views of solder arrays and available surfaces on ball grid arrays.

FIGS. 5A, 5B, 5C, 5D, and 5E are bottom views of thermoplastic adhesive applied to the available surfaces on ball grid arrays.

DETAILED DESCRIPTION OF THE INVENTION

As used throughout, the terms "comprising," "containing," and "including" are open ended and mean the inclusion of at least the identified ingredients, methods, etc, but do not preclude the addition of other ingredients, methods, steps, and the like.

Surface mount electronic devices used in the invention are integrated circuits mounted on a connecting substrate attachable to the surface of a printed circuit board. By contrast, through hole electronic devices have a connecting substrate to which are attached pins inserted through holes in the printed circuit board.

The surface mount electronic devices contain an integrated circuit. An integrated circuit (IC) is a semiconductor wafer on which thousands or millions of tiny resistors, capacitors, and transistors are fabricated. The function of the IC is not particularly limited. For example, the electronic devices can function as amplifiers, oscillators, timers, counters, computer memory including flash memory, or microprocessors. The IC's can be linear or digital, depending on the intended application.

The integrated circuit is mounted on a connecting substrate manufactured from a wide variety of materials. The connecting substrate is used to support the IC and connect the IC to the external leads on the surface mount electronic device through contacts on and vias through the connecting substrate. The shape and configuration of connecting substrate varies widely depending upon the application and technology development, and is not limited in the invention. Most connecting substrates, however, have a conductor pattern layer and an insulator layer, and in some cases, further contain a non-conducting reinforcing layer adhesively bonded to the insulator layer. In other configurations, the IC may be bonded adhesively to the insulator layer directly or through other layers.

Surface mount electronic devices generally follow two types of construction, a leaded surface mounted construction and a ball grid array construction. In leaded surface mount electronic devices, the conductor pattern on the connecting substrate terminates with terminal leads, generally around the periphery of the connecting substrate. The leaded surface mounted package may optionally, and usually is, encapsulated with a sealing resin such as an epoxy resin. In a ball grid array (BGA), the bottom surface of the connecting substrate on the surface mount electronic device is leaded with solder bumps rather than terminal leads. By a bottom surface is meant the surface which is designed to face the printed circuit board during attachment of the surface mount electronic device. The IC may, however, be mounted to either the upper or bottom surface of the connecting substrate.

There exists a variety of methods for contacting the IC chip to the connecting substrate. In general, the IC is connected to external leads by a wire bonding (WB) technique or by a tape automated bonding (TAB) technique or by a flip chip design.

Figure 1:
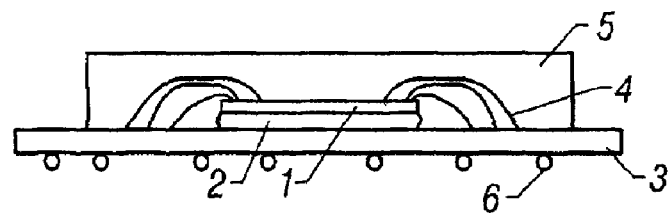
FIG. 1 is a cross section view of ball grid array.

In a WB BGA configuration, the electrodes of the IC are wire bonded to contact pads or internal leads generally on the upper surface of the connecting substrate through vias to the bottom major surface of the connecting substrate. This type of configuration is illustrated in FIG. 1. The top of the surface mount electronic device connecting substrate is the surface facing away from the printed circuit board, and the bottom surface is the surface to which are attached the solder bumps for attachment to the printed circuit board.

In a TB BGA configuration, the metal (typically gold) electrodes of the IC are thermally pressure-bonded to the inner leads through the connecting support substrate. The BGA is usually encapsulated with a sealing resin such as an epoxy resin. For example, in a μBGA, the IC is attached to a tape, such as a polyimide to act as the connecting substrate, through an elastomer and is electrically connected by electrodes to contacts attached to solder balls under the tape. The whole assembly may be encapsulated with an epoxy resin.

Figure 2:
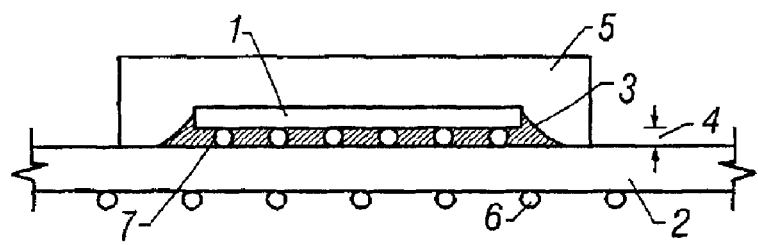
FIG. 2 is a cross section view of a flip chip ball grid array.
Figure 3:
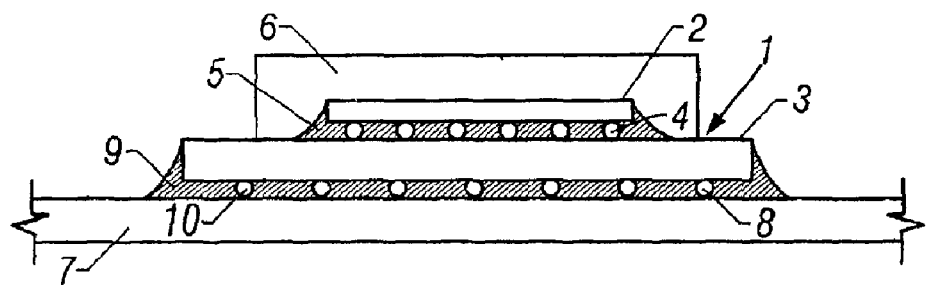
FIG. 3 is a cross section view of a flip chip ball grid array mounted on a printed circuit board and underfilled with a thermosetting resin.

Other types of configurations are also known and practiced, such as flip chip BGAs, as shown in FIG. 2, in which solder bumps are formed on the IC, the IC is flipped over and aligned and solder reflowed onto a connecting support substrate containing solder bumps on its inner surface, after or during which a sealing resin is disposed between the IC and the connecting support substrate as an underfill.

Any BGA is suitable for use in the process of the invention, including plastic BGAs called PBGAs, flex tape BGAs (TBGAs), flip chip (FCBGA)-style, and Chip Scale Packages (CSP), also called μBGA's, which have a die size near the size of the package with a ball pitch of 1 mm or less. A CSP may contain a single die or may contain a stacked die arrangement. CSP's are particularly useful in applications using flash memory and SRAM, such as mobile hand held devices like cellular phones, pagers, personal digital assistants and wireless web modules (Palm™ handhelds and Blackberry™ handhelds) and GPS units. The PBGA's, TBGA's, FCBGA's are useful in many embedded applications, such as aircraft, automobiles, tele/data systems, and networking systems.

Other types of useful surface mounted electronic devices which can be adhered to printed circuit boards using the process and adhesive of the invention include LCC chip carriers and quad flat packs such as TQFP's, LQFP, BQFG's, and SSOP (gull wing), TSSOP's, MSOP, and HSOP's, J-lead flat packs such as SOIC's, surface mount transistors such as SOT's and DPAK's, and diodes such as SOD's, surface mount chip capacitors.

The connecting substrate is made of any material useful to insulate while providing sufficient rigidity to support the conducting pattern, internal leads or wiring and vias, and the IC. The connecting support substrate may be rigid or flexible or a tape, and its thickness is generally within a range of 10 to 2000 μm. The connecting substrate is organic, and preferably a plastic. Examples of suitable organic connecting substrate materials include a polyimide such as bismaleimide triazines and their laminates, polyester, polycyclohexylene terephthalates, liquid crystal polymers, polyphenylene sulfide, liquid crystal polymers, polyether sulfone, polyether ether ketone, aramid, polycarbonate or polyarylate, or composite materials such as paper or glass cloth impregnated with phenolic epoxy resins such as phenolic resin impregnated paper (FR-2), a paper composite which has been impregnated with epoxy resins (FR-3), CEM-1, and FR-4 typically made of glass fibers impregnated with epoxy resins. In addition to paper or glass substrates for impregnation, Teflon™ may also be used. Preferred substrate materials are polyimides (bismaleimide triazine), phenolic or epoxy resin impregnated paper or glass or laminates thereof, liquid crystal polymers, polyphenylene sulfides and polycyclohexylene terephthalates; and polyimides have found widespread use in commerce.

The IC and optionally a portion or the whole of the connecting substrate is commonly encapsulated with a thermosetting or a reversible thermosetting sealer. Examples of encapsulating resins include epoxy resin, polyimide resin, maleimide resin, silicone resin, phenol resin, polyurethane resin and acryl resin. An example of a thermally reworkable crosslinked encapsulating resin is a resin produced by reacting at least one dienophile having a functionality greater than one and at least one 2,5-dialkyl substituted furan-containing polymer and a filler.

The type of printed circuit board is not limited and includes any known printed circuit board. The printed circuit board may be rigid or flexible, single, double or multi-layered into a laminate, all depending upon the application. In general, rigid printed circuit boards are glass laminates, copper clad, on which are etched lands or landing pads connected with tracers, optionally to vias, on one or both sides onto which the surface mount electronic device leads are mounted. Each layer and inner layer may have its own land pattern. Land patterns include patterns designed to fit 0.050" pitch J-leaded devices, 0.050" pitch gullwing leaded devices, sub 0.050" pitch gullwing leaded devices, and chips having solder bump arrays. While a typical landing pad is connected to a via by way of tracers, the invention is not limited to mounting a surface mounted electronic device onto a conventional landing pad. The term "landing pad" is used herein for convenience to refer to any type of connector on a printed circuit board adapted to receive and establish an electrical connection with a surface mounted electronic device. A screen printed solder mask, such as a dry film or liquid photo-imageable mask, is usually applied on the printed circuit board to prevent solder bridging between the pads and tracers.

Pre-pregs may be laminated (or electrodeposited) with a metal foil such as copper foil under heat and pressure, trimmed, removal of the oxidation retardant on the metal foil by means of an acid cleaner or scrubbed, followed by laminating a light sensitive photo resist onto the board. Once the photo image is imprinted by intense light, the unexposed film is chemically removed, leaving behind an exposed metal surface which is etched off. The remaining photo resist is chemically stripped, leaving behind a pattern of conductive lands. Alternatively, additive processes for making land patterns are also know by building up metal on the unmasked areas through a negative pattern photoresist.

The vias on the printed circuit board can be created by plasma etching, laser drilling, mechanical drilling with bits, or photovia processes.

The adhesive of the invention and used in the process of the invention is thermoplastic, in contrast to the thermosetting resins which have been in general use as underfills between the IC and the connecting substrate, or between the surface mount electronic device and the printed circuit board. By a thermoplastic adhesive is meant a resin which can be repeatedly melted by heat and returned to its original condition upon solidification. The molecular weight of the thermoplastic adhesive as applied to the surface mounted electronic device or printed circuit board does not significantly increase through repeated heat/cool cycles at solder reflow temperatures. Moreover, the thermoplastic adhesive is not substantially crosslinked. By substantially crosslinked is meant a degree of crosslinking less than 30%.

The thermoplastic polymer used in the process of the invention, and the thermoplastic polymer of the invention, is an adhesive. By an adhesive is meant a thermoplastic polymer which is capable of bonding by surface attachment to the bottom surface of an organic connecting substrate and to the printed circuit board surface, its cladding, or its solder mask, depending on the type of printed circuit board used, with sufficient strength to remain bonded to both surfaces under gravity loads at ambient conditions. Preferably, the thermoplastic adhesive is non-electrically conducting since it is not used as a conductive adhesive between the solder bumps and the landing pads on a printed circuit board.

The thermoplastic adhesive is preferably a solid or semi-solid at room temperature, meaning that the thermoplastic adhesive substantially retains its dimensions under handling conditions at zero shear. For example, adhesives having the consistency of pastes, gels, or ointments are not considered semi-solids for purposes of this invention since they will readily change their shape if handled. However, softened solids which may bend even under the mere force of gravity, but which can be handled without substantially altering their dimensions are considered to be semi-solids.

There exist various techniques by which the thermoplastic adhesive may be applied to a surface mounted electronic device or printed circuit board. In general, the thermoplastic adhesive may be pre-applied and adhered to the printed circuit board or bottom surface of the connecting substrate of the surface mount electronic device prior to bonding the printed circuit board and the surface mount electronic device to each other, or the thermoplastic adhesive may be post-applied to an assembly of the printed circuit boards and the surface mount electronic devices after solder reflow. Each of these options are described below in more detail. With each of these options, the form or state of the thermoplastic adhesive during application is not critical. An advantageous feature of using a thermoplastic adhesive in the process of the invention is that it may be used in a solid state, semi-solid state, tacky state, or in a liquid state, each during pre-application to a printed circuit board or the surface mount electronic device before solder reflow or after solder reflow in the case of post-application, except that liquids should be allowed to cool to a semi-solid before mounting the surface mounted electronic device on the printed circuit board.

In one embodiment of the invention, the thermoplastic adhesive is surface bonded to a portion of the organic bottom surface of the connecting substrate on a surface mount electronic device. This embodiment is well suited for high volume manufacturing operations. By applying the thermoplastic adhesive to the bottom surface of the connecting substrate, the steps of applying the adhesive and bonding the printed circuit board to the surface mount electronic device are simplified. In a more preferred embodiment, optimal reliability can be obtained by applying the thermoplastic adhesive in a solid or semi-solid state to a portion of the bottom surface of the connecting substrate in order to have accurate dimensional control over its height in the gap between the surface mounted electronic device and the printed circuit board.

In these embodiments, the thermoplastic adhesive can be mechanically laid onto a portion of the bottom surface of the connecting substrate of surface mount electronic device. Unlike an underfill method which covers the entire bottom surface of a surface mount electronic device, good adhesion between the printed circuit board and the surface mount electronic device is achieved by applying the thermoplastic adhesive to a portion of the available surfaces on the bottom of the connecting substrate.

The "available" surfaces for adhesion are those surfaces along the bottom of the connecting substrate which are devoid of the solder bumps themselves and which are outside of areas between adjacent solder bumps. To the extent that an encapsulating resin forms a part of a bottom surface facing the printed circuit board after assembly, such as in a die down configuration, the encapsulant is deemed to form a part of the connecting substrate and is considered to be an available surface.

Examples of available surfaces are depicted in FIGS. 4a, 4b, 4c, 4d, and 4e, which illustrates a variety of array patterns on the bottom surfaces of connecting substrates on BGA chips. The available surfaces are shown as the white areas 1 outside of the solder ball arrays 2. A large variety of configurations can be designed along the available surfaces to suit optimal manufacturing conditions. Even in CSP's, a large number of configurations for adhesion are available.

The shape of the thermoplastic adhesive as applied to the available surfaces and the location of application is also not limited. Examples of the kinds of shapes the thermoplastic adhesive may take as applied to available surfaces and their location are depicted in FIGS. 5A, 5B, 5C, 5D, and 5E. In each of these figures, reference number 1 represents the solder balls on the bottom surface of a connecting substrate of a BGA. In FIG. 5B, the thermoplastic adhesive 3 is adhered to an available surface 2 at a location along all four edges of the connecting substrate perimeter as strips. In FIG. 5C, the thermoplastic adhesive 3 is adhered on available surfaces 2 as strips at a location along three edges of the BGA perimeter. In FIG. 5D, the thermoplastic adhesive 3 is applied on available surfaces at a location along two BGA perimeter edges as strips. In FIG. 5E, the thermoplastic adhesive 3 is applied to available surfaces 2 as squares along each of its four corners, and in FIG. 5A, the thermoplastic adhesive 3 is applied on available surfaces 2 as squares offset from the corners of the connecting substrate, and if desired may be centered along each of the sides of the substrate. Examples of other suitable shapes include dots, ovals, rectangles, waves, stars, sheets, films, spheres, blocks, or preforms.

The state of the thermoplastic adhesive as applied is also not limited. Instead of applying the thermoplastic adhesive to the surface mount electronic device or the printed circuit board as a solid or a semi-solid, the thermoplastic adhesive may be hot melted and applied in liquid form as a dot, strip, wave, or other desirable shape, and subsequently allowed to cool sufficiently to maintain its form integrity sufficient to avoid dripping or smearing during handling, such as when the surface mounted electronic device is flipped or oriented toward the printed circuit board. However, the shape and state of the thermoplastic adhesive may change at any point from the manufacturing step of the thermoplastic adhesive through the solder reflow step.

Suitable methods for the application of the thermoplastic adhesive to the available surfaces include any conventional methods for the application of adhesives to surfaces in general. These include the application of a pressure sensitive adhesive to the thermoplastic adhesive, the application of pressure to the thermoplastic adhesive itself, or the application of heat to the printed circuit board, the surface mounted electronic device, and/or to the thermoplastic adhesive in order to soften or tackify the thermoplastic adhesive using convection, forced air, microwave, ultrasonics, irradiation, or any other heating means. When applying heat, the solid thermoplastic adhesive may be locally heated or globally heated in an oven at a temperature to soften the thermoplastic adhesive sufficient to adhere to the connecting substrate. The thermoplastic adhesive may be heated first, locally or globally, and laid up or placed on the connecting substrate. Alternatively, the cold thermoplastic adhesive may be laid up or placed on the connecting substrate of a surface mounted electronic device, or on the printed circuit board, followed by heating the surface mounted electronic device or printed circuit board on which is laid the thermoplastic adhesive in an oven at a temperature sufficient to provide adhesion. Instead of an oven, the thermoplastic adhesive may be passed under a stream of hot forced air. Alternatively, the printed circuit board or the surface mounted electronic device may be preheated to a temperature sufficient to tackify the thermoplastic adhesive, followed by laying down on its surface a non-tacky thermoplastic adhesive for a time sufficient to allow the thermoplastic adhesive to become tacky and adhere to the surface. The thermoplastic adhesive is heated at least partially by heat transfer from the surface of the printed circuit board or the surface mounted electronic device, and optionally also heated by external heating, globally or locally. Optionally, the thermoplastic adhesive may be pre-heated, to any temperature so long as the adhesive can continue to be handled, before it is laid onto the surface of the printed circuit board or surface mounted electronic device. Optionally, pressure may be applied to the thermoplastic adhesive as it is placed on the printed circuit board or the surface mounted electronic device to increase the surface area contact and secure the formation of a bond to the surface.

In another method, the thermoplastic adhesive can be formed into pellets or any other desired shape, loaded into a hot melt machine, and dropped or injected as a liquid in any desired shape onto the available surfaces on the connecting substrate or printed circuit board. If a hot melt is applied, however, it is desirable to allow the adhesive to form at least a semi-solid prior to mounting the surface mounted electronic device on the printed circuit board to avoid changing its dimensions and risk smearing or impinging on a landing pad or solder ball.

In the case of applying the thermoplastic adhesive to the available surfaces on the connecting substrate by pressure at room temperature or at elevated temperatures, any conventional method known for the manufacture and application of pressure sensitive adhesives (PSA) is suitable. The PSA is applied in a quantity and pattern sufficient to tack the thermoplastic adhesive to the connecting substrate and avoid movement of the thermoplastic adhesive during handling of the surface mounted electronic device. Methods for applying a PSA include spraying a PSA, preferably in a pre-selected pattern, to at least a portion of at least one surface of an extruded sheet of the thermoplastic adhesive. Alternatively, a PSA is applied to a release film, preferably in a pre-selected pattern, which in turn is applied to the thermoplastic adhesive for shipping and handling. Upon removal of the release film, the PSA adhesive is transferred to the thermoplastic adhesive film. In one embodiment, a continuous or discontinuous releasable PSA is deposited onto the thermoplastic adhesive sheet or a release film and transferred to the thermoplastic adhesive sheet. It is advantageous to use a releasable PSA so that the thermoplastic adhesive can be easily removed from the printed circuit board in the event the surface mount electronic device is reworked. It is also preferred to deposit a PSA to only a portion of the thermoplastic adhesive applied to the connecting substrate surface to provide a substantial surface area for surface bonding the thermoplastic adhesive at the thermoplastic adhesive/substrate interface. Once the desired shape of the thermoplastic adhesive is selected, the PSA may be applied to the thermoplastic adhesive in a pattern selected to provide a thermoplastic adhesive/connecting substrate interface on a portion of the thermoplastic adhesive and a thermoplastic adhesive/PSA/connecting substrate interface on another portion of the thermoplastic adhesive. It is desirable that at least 25%, more preferably at least 50%, most preferably at least 75% of the thermoplastic adhesive surface area bonded to the connecting substrate is free of the PSA.

Suitable PSA are any of the any of the conventional PSA's known in the field of adhesives. PSA's can be selected from natural rubber, styrene-butadiene rubber, styrene-isoprene rubber, polyisobutylene, butadiene-acrylonitrile rubber, polyvinyl ethers, acrylic based adhesives such as polyacrylate esters, and silicones.

Whether the thermoplastic adhesive is applied to the available surfaces on the connecting substrate as a solid, semi-solid, or as a liquid, it is preferred to allow the thermoplastic adhesive to cool to a solid or at least a semi-solid prior to mounting the surface mount electronic device onto a printed circuit board in order to avoid the risk of run off, spread, stretch or undue widening of the thermoplastic adhesive during handling of the surface mount electronic device. If desired, the thermoplastic adhesive can be applied to the available surfaces in a tacky state, and can optionally be made tacky after application to the surface mounted electronic device and prior to mounting the surface mounted electronic device onto the printed circuit board.

Figure 6:
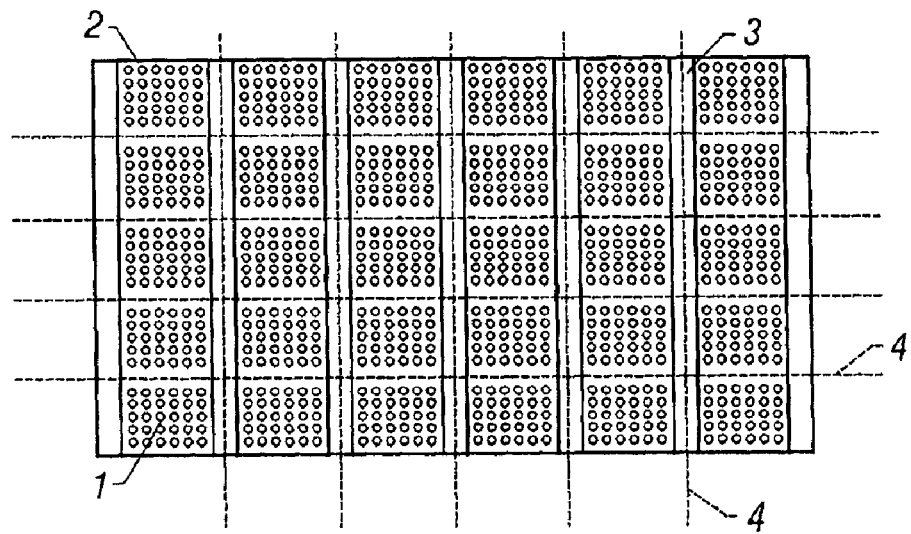
FIG. 6 is a top view of thermoplastic adhesive strips applied to a sheet of ball grid array devices.

Many surface mounted electronic devices are manufactured in large sheets containing an array of surface mount electronic devices. The thermoplastic adhesive can be mass pre-applied by laying down the thermoplastic adhesive on the available surfaces between each of the surface mount electronic devices on the sheet. For example, the thermoplastic adhesive may melt extruded into a sheet, slit into strips or stamped into squares, and applied onto the desired available surfaces between the surface mount electronic devices. FIG. 6 illustrates this embodiment. Solid thermoplastic adhesive strips 3 are laid on a sheet 2 of BGA's between the columns of BGA solder ball arrays 1, or the rows, or both if desired. The BGA's are singluated from the sheet 2 of BGA's by cutting along centerlines 4 of the columns and rows between the solder ball arrays. Preferably, the thermoplastic adhesive strips are laid up on the centerline of the cuts such that when the BGA's are singulated, the cuts divide the thermoplastic adhesive strips down their centers and lengthwise, as depicted in the dashed lines 4. This process results in providing single BGA's having thermoplastic adhesive laid along at least two edges of the connecting substrate as shown in FIG. 5D.

Figure 7:
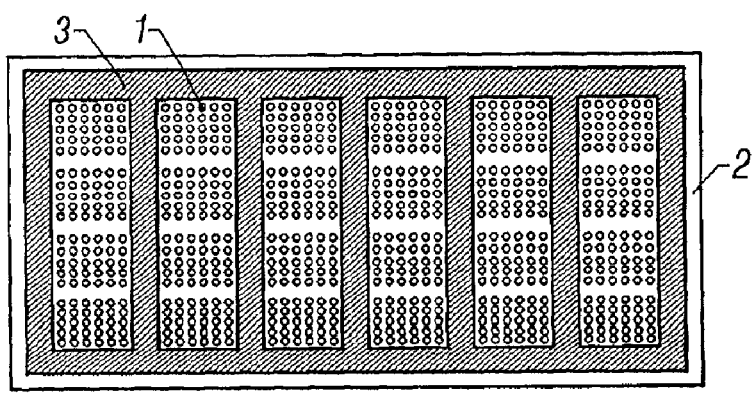
FIG. 7 is a top view of a thermoplastic adhesive preform applied to a sheet of ball grid array devices.

Alternatively, the sheet of solid thermoplastic adhesive may be stamped or molded into a preform having a pattern which corresponding to a pre-selected pattern along available spaces on the sheet of surface mount electronic devices, followed by laying down the preformed sheet onto these available surfaces. FIG. 7 is a top view example of a thermoplastic adhesive preform mounted on a sheet of ball grid arrays. The thermoplastic adhesive 3 preform is laid down onto the sheet 2 of BGA's The preform 3 is shaped to fit between the columns of the solder ball arrays 1. The thermoplastic adhesive preforms can have any thickness desired. In one embodiment, the preform has a thickness ranging from 5 mils to 15 mils. In another embodiment, the preform has a thickness ranging from 8 mils to 13 mils.

In addition to high volume manufacturing methods, the thermoplastic adhesive of the invention may also be applied to individual surface mount electronic devices. Application of the thermoplastic adhesive onto individual surface mount electronic devices is particularly attractive for rework or repair applications. The thermoplastic adhesive may be pre-applied to the surface mount electronic device at the time the surface mount electronic device is manufactured in a high volume manufacturing operation, or it may be applied to the individual surface mount electronic device at the time of use, or individually applied by the manufacturer of the surface mounted electronic device. For example, with respect to surface mount electronic devices destined for rework or repair operation, the thermoplastic adhesive may be pre-applied as mentioned above in high volume manufacturing methods, or the surface mounted electronic device may be first singulated followed by mass applying the thermoplastic adhesive to each surface mounted electronic device. In another embodiment, the thermoplastic adhesive may be individually applied to a surface mount electronic device by a technician during a rework or repair operation. It is preferred to mass pre-apply the thermoplastic adhesive to the surface mount electronic devices, whether the surface mounted electronic device are singulated after or before application of the thermoplastic adhesive. In this way, the technician avoids the step of applying the thermoplastic adhesive during rework or repair.

The surface mount electronic device is provided with solder to establish an electrical connection through a solder bridge between the surface mount electronic device and the printed circuit board. The sequence of providing the solder and a thermoplastic adhesive on the surface mount electronic device is not limited. The invention includes adhering a thermoplastic adhesive to the bottom surface of a surface mount electronic device provided with solder as well as adhering a thermoplastic adhesive to the bottom surface of a surface mount electronic device devoid of solder, followed by application of solder to the connecting terminals in the vias of the connecting substrate. In most cases, however, the thermoplastic adhesive is set onto the available space of a connecting substrate after the solder has already been applied to the connecting substrate.

Prior to mounting the surface mount electronic device onto the printed circuit board, a solder paste is optionally applied on the landing pads of the printed circuit board. The solder paste can serve a multitude of functions, including slightly adhering the solder balls to the landing pads prior to reflow and aligning solder balls skewed from the center of the landing pads during solder reflow, and removing oxides from the landing pads with the flux rosin in the paste used to wet the landing pads. The solder paste can be applied using a screen printer and a stencil. Suitable solder pastes include rosin mildly activated paste, water-soluble organic acid, and no-clean pastes.

Figure 8:
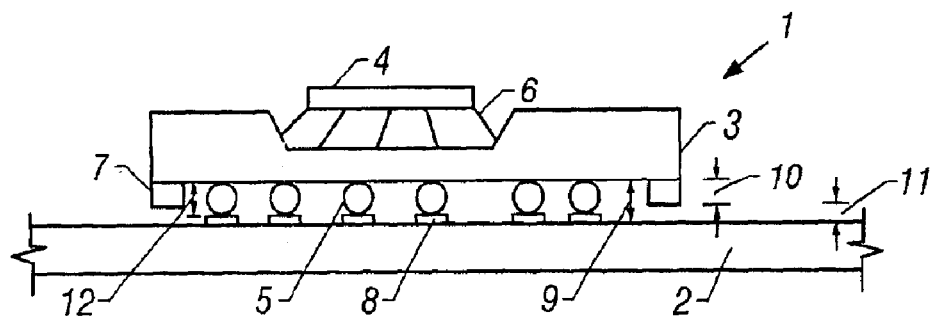
FIG. 8 is a cross section view of a surface mounted electronic device having thermoplastic adhesive applied to its connecting substrate and mounted on a printed circuit board.

Once the thermoplastic adhesive is applied to the bottom surface of the connecting substrate on the surface mount electronic device, the surface mount electronic device is mounted onto the printed circuit board to form an assembly in which the solder balls on the surface mount electronic device are aligned with the corresponding landing pads on the printed circuit board. The surface mount electronic device is oriented with the thermoplastic adhesive facing the printed circuit board. The thermoplastic adhesive adhered to the surface mount electronic device may be sized to contact the printed circuit board when the solder contacts are aligned, or preferably the thermoplastic adhesive is sized to allow a gap between the thermoplastic adhesive and the printed circuit board. At this point, the thermoplastic adhesive may be liquid, semi-solid, or solid, but is preferably semi-solid or solid in order to maintain dimensional control FIG. 8 depicts a cross-sectional view of a BGA 1 mounted onto a printed circuit board 2. On the top surface of the connecting substrate 3 is mounted an integrated circuit 4 connected indirectly to an array of solder bumps 5 through an interconnecting matrix 6 of one's choosing (e.g. TAB, WB, Flip Chip, through vias). The thermoplastic adhesive 7 is attached to an available surface on the bottom of the connecting substrate 3. The BGA 1 is mounted onto the printed circuit board 2 by aligning the BGA solder balls 5 with the landing pads 8 on the printed circuit board 2, thereby forming an assembly gap width 9 (assembly gap width is before solder reflow). In the assembly form, the thermoplastic adhesive is a solid or semi solid. If a liquid thermoplastic adhesive was applied to the surface mounted electronic device, it should be given sufficient time to cool to a semi-solid or solid state prior to mounting the surface mounted electronic device on the printed circuit board. There is also a solder bump height 12 which may be the same as or less than the gap width 9 depending on the dimensions of the landing pads 8.

In this illustration of the invention, the thermoplastic adhesive 7 has a height 10 which is less than the assembly gap width 9, and preferably less than the solder bump height 10. Providing a gap 11 between the thermoplastic adhesive and the printed circuit board not only allows freedom of movement for adjustments during the alignment step, but more importantly ensures that all the solder leads on the surface mount electronic device are in contact with the contact pads or solder leads on the printed circuit board. In some embodiments, it is not desirable to design the thickness of the thermoplastic adhesive to correspond to the assembly gap width because with such extreme close tolerances in the gap, especially with μBGA's, it is conceivable and probable that the actual thickness of the thermoplastic adhesive under manufacturing conditions will be larger than the gap, resulting in a failure to make all the required solder connections. Further, because of minor deviations in solder ball pitch or board warpage, in conduction with minor deviations in thermoplastic adhesive thickness, it is advantageous to design the height of the solid thermoplastic adhesive as adhered to the bottom surface of the connecting substrate or the printed circuit board to be less that the assembly gap width prior to solder reflow. Thus, as shown in FIG. 8, sizing the thermoplastic adhesive 7 to a height which is less than the assembly gap height 9 ensures reliable contact between the BGA solder balls 5 and the landing pads 8 on the printed circuit board prior to solder reflow.

The minimum height of the solid thermoplastic adhesive depends on the solder height, the pad height, the solder paste height if applied, and the sag of the solder on reflow. The starting gap height between a surface mount electronic device connecting substrate and the printed circuit board prior to solder reflow is always reduced by a certain percentage after solder reflow because during reflow, the solder compresses under the weight of the surface mount electronic device ("reflow gap reduction"). For example, the solder balls of a CSP may lose from 60 to 80 μm height during a solder reflow operation. In general, the reflow gap reduction ranges from 15 to 40%. This reflow gap reduction is taken into account, as well as the necessity for forming a strong adhesive joint.

Thus, in one embodiment, the thermoplastic adhesive applied to the connecting substrate has a height which is designed to be equivalent to the assembly gap width reduced by the reflow gap reduction. In another embodiment, the thermoplastic adhesive is designed to have a height less than assembly gap width reduced by the reflow gap reduction to allow some flow of the thermoplastic adhesive and avoid the risk of underfilling or overflow, and to reduce the quantity of thermoplastic adhesive used. However, the height of the solid thermoplastic adhesive should be sufficient to at least ensure the formation of an adhesive joint.

In another preferred embodiment, the height of the thermoplastic adhesive is 90% or less of the assembly gap height, and more preferably is 70% or less than the assembly gap height, and is preferably at least 25% of said gap height, and more preferably at least 40% of said gap height. In yet another preferred embodiment, the height of the thermoplastic adhesive is 90% or less of the solder bump height, and more preferably is 70% or less than the solder bump height, and is preferably at least 25% of said solder bump height, and more preferably at least 40% of the solder bump height.

Figure 9:
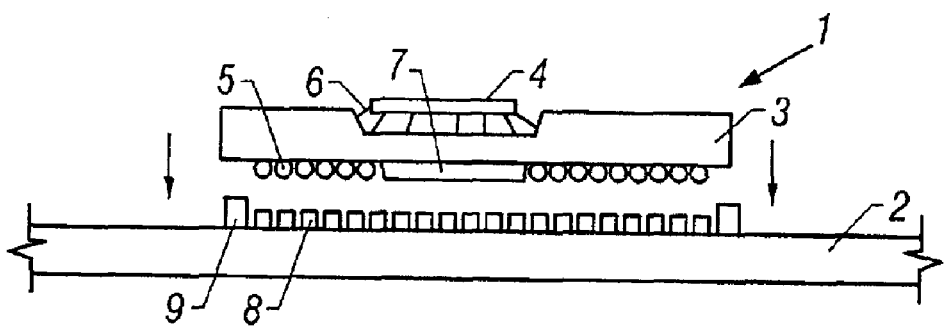
FIG. 9 is a cross section view of a surface mounted electronic device optionally having a thermoplastic adhesive being mounted onto a printed circuit board having a thermoplastic adhesive.

In another embodiment, the thermoplastic adhesive may be adhered to the printed circuit board prior to mounting the surface mounted electronic device onto the printed circuit board. This embodiment is illustrated by way of example in FIG. 9. BGA 1 is comprised of a connecting substrate 3 having an IC die 4 connected thereto by wires 6 which are connected indirectly to the solder balls 5. The BGA 1 is aligned with the landing pads 8. Thermoplastic adhesive 9 is adhered to the surface of the printed circuit board and has a height such that when the BGA is mounted and solder reflowed, the thermoplastic adhesive contacts the connecting substrate 3. Optionally, a thermoplastic adhesive 7 may also be applied to the connecting substrate. While this embodiment is illustrated with respect to a BGA, it will find particular use for mounting surface mount transistors, capacitors, and diodes where a thermoset adhesive is typically applied in any case to the printed circuit board. This FIG. 9 is also an illustration of a repair operation, wherein the thermoplastic adhesive 9 may be represented by used adhesive, and fresh thermoplastic adhesive 7 is applied to the connecting substrate 3 of replacement BGA 1 at a location different from the used thermoplastic adhesive 9.

Methods for mounting a surface mount electronic device onto a printed circuit board are known. Commonly used techniques employ auto-placement machines to ensure the accuracy of aligning the solder bumps with the landing pads on the printed circuit board. Auto-placement machines include the in-line which places the surface mount electronic device onto the printed circuit board as the board moves down a line (and several lines can be used); simultaneous machines in which simultaneously place an array of components onto the printed circuit board; sequential machines in which components are placed sequentially onto the printed circuit board on an X-Y moving table system; and sequential/simultaneous placement machines, which is the same as the sequential except that multiple heads are used for placement.

In another embodiment, there is provided an assembly comprising a printed circuit board, a surface mount electronic device, solder joints contacting the device and the board, and thermoplastic adhesive joints contacting the device and the board. The solder joint may be solder joints formed by soldering or solder reflowing terminal leads to the landing pads, or reflowing solder balls to the landing pads.

Once the surface mount electronic device and the printed circuit board are properly oriented and aligned, the assembly is heated under solder reflow conditions to melt the solder, if one is provided, sufficient to provide a solder joint between the solder contacts on the printed circuit board and the surface mount electronic device. The solder reflow conditions are also effective to provide a thermoplastic adhesive joint surface bonding the bottom surface of the connecting substrate to the printed circuit board surface.

In another embodiment, there is a process for adhering the connecting substrate to a printed circuit board by at least softening a solid thermoplastic adhesive applied to the bottom surface of the connecting substrate sufficiently to flow the thermoplastic adhesive and provide an adhesive bond between the bottom surface and the board. While the heating conditions are at least sufficient to soften the thermoplastic adhesive, it is preferred to melt the thermoplastic adhesive.

The conditions applied to reflow the solder and provide solder joints are well known to those of skill in this technology, and vary depending upon the type of surface mounted electronic device being attached, the type of solder, the equipment used, assembly conditions, the reflow profile, and the printed circuit board design. Different technologies useful to both reflow the solder (and solder paste) and to provide an adhesive joint include Infra-Red, which employs a focused radiant heat quartz lamp source; Infra-Red-Convection oven, which employs a non-focused forced air convection heat from heaters; vapor phase, and laser scanning technologies, each which can be used to heat the solder as well as the thermoplastic adhesive. A commonly used technique is to pass the assembly by conveyor through IR/Convection ovens, which would simultaneously melt the solder and the thermoplastic adhesive. Most reflow uses IR Convection forced air heat to take advantage of improved heat transfer as hot air is continuously being replenished in a large volume.

The peak temperature for soldering surface mount electronic devices to printed circuit boards is typically within the range of 200° C. to 225° C. The peak solder reflow temperature is the temperature of the solder ball. At higher temperatures for surface mount electronic devices, one risks delaminating the internal layers of the surface mount electronic device, which can exceed the solder ball temperature by 20–30° C. at their surfaces. However, peak solder reflow temperatures ranging from 180° C. to 260° C. have been used in solder reflow operations.

As used throughout this description, "solder reflow" and "solder reflow step" is not limited to providing a solder or solder paste on either the surface mounted electronic device or the printed circuit board, followed by reflowing the solder. This term as used herein is for convenience and also encompasses solderless construction of assemblies, such as by thermal compression welding. The conditions for solderless construction are typically at higher temperatures, generally in the range of 220° C. to 260° C. In its broad sense, the term "solder reflow" only requires conditions which soften or melt the thermoplastic adhesive sufficiently to provide for a thermoplastic adhesive joint between the printed circuit board and the surface mounted electronic device, regardless of the technique used to establish electrical connections.

During the solder reflow step, the thermoplastic adhesive at least softens, and preferably melts since its melting point is at or below the peak temperatures applied in a solder reflow step. The thermoplastic adhesive is advantageously formulated to have melt flow properties which allow it flow across the gap between the thermoplastic adhesive and the printed circuit board and make contact with the printed circuit board without run off, overflow or underfilling the surface mount electronic device. By formulating the thermoplastic adhesive to flow across a gap during solder reflow, tolerances on the height of the thermoplastic adhesive during sheeting can be wider. The action of the molten thermoplastic adhesive across the gap can be likened to a sagging or drooping motion. The molten thermoplastic adhesive on the connecting substrate is capable of contacting the printed circuit board without the application of external force to the printed circuit board or to the surface mount electronic device. The action of gravity alone is sufficient to pull the molten adhesive across the gap between the thermoplastic adhesive and the printed circuit board, contact the printed circuit board, and form an adhesive bond with the printed circuit board through capillary action. Although force can be applied to compress the printed circuit board and the surface mount electronic device together, it is an additional step which is not used in practice and is preferably not introduced into the process of the invention as it would be costly and risk solder smear.

The thermoplastic adhesive also preferably has a rheology which not only allows it to flow across the gap and contact the printed circuit board to form an adhesive joint, but also does not overflow or underfill the gap, during the time the temperature is ramped up to peak solder reflow temperature and cooled back down to the thermoplastic adhesive solidification temperature. By an overflow is meant a flow which impinges on the side of a solder ball. An underfill is an extreme case of overflow where the adhesive has flowed between numerous solder balls within the array. Generally, the assembly will be heated at a rate of 1° C. to 3° C. per second, is held at peak solder reflow temperatures for 30 seconds to 1 minute, and cooled at a rate of 2° C. to 4° C. For example, if the thermoplastic adhesive has a melting range of about 130° C. to 150° C. and the peak solder reflow temperature is 210° C., the thermoplastic adhesive may remain in the molten state in a range of 70 seconds up to 165 seconds (taking 140° C. as the median). During the heating and cooling cycle, the thermoplastic adhesive in its molten state must remain adhered to the bottom surface of the connecting substrate and the printed circuit board, avoid overflowing or underfilling, and on solidification retain a shape which provides an adhesive joint.

Figure 10:
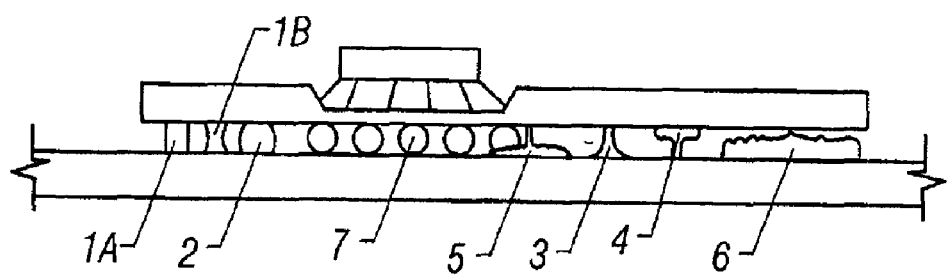
FIG. 10 is a cross section view of various forms of thermoplastic adhesive joints between a surface mounted electronic device and a printed circuit board.

FIG. 10 is a cross-sectional view of the various forms an adhesive joint may take after a solder reflow step and after solidification. Joints 1a and 1b are examples of preferred shapes which a thermoplastic adhesive having the preferred height and viscosity profile will take after solidification. Joints 2, 3 and 4, within the scope of the invention, will also function to provide an adhesive joint. However, joint 2 is indicative of applying a thermoplastic adhesive having a height as large as or larger than the after solder reflow gap width and having a viscosity slightly higher than optimal and did not deform until solder reflow reduced the gap width, or until it is squeezed. However, tight viscosity tolerances are less of a concern in cases where large available surface areas are present, or where the device does not have solder balls, or where pressure is applied to the surface mounted electronic device prior to solder reflow to ensure good electrical connectivity Joint 3 is indicative of applying an adequate amount of thermoplastic adhesive but which had a viscosity, under the particular solder reflow conditions, slightly lower than optimal, while the viscosity of the thermoplastic adhesive as shown in joint 5 was slightly higher than optimal. However, each of these thermoplastic adhesive joints are suitable since each have formed a heel and foot in contact in contact with the surfaces. Joint 5 is an example of a thermoplastic adhesive which overflowed and impinged on a solder ball connection. Joint 6 is an example of applying an excessive quantity of a thermoplastic adhesive having a low viscosity. This joint not only overflowed but is also at risk of breaking.

Figure 11:
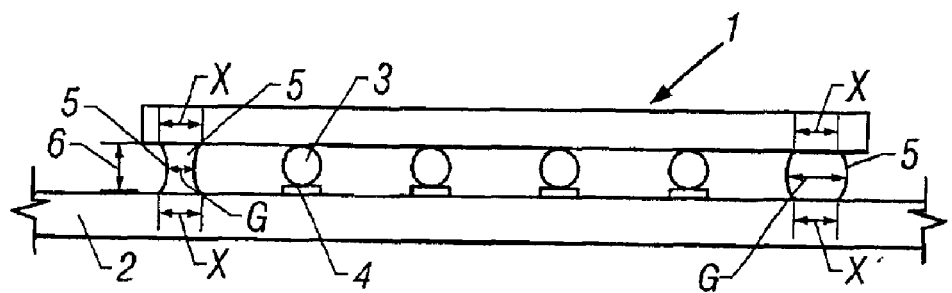
FIG. 11 is a cross section view of various forms of thermoplastic adhesive joints between a surface mounted electronic device and a printed circuit board.

In one embodiment, there is provided an adhesive joint having specific dimensions between the connecting substrate and a printed circuit board. FIG. 11 is a cross sectional illustration of this embodiment. A BGA 1 is solder bonded to a printed circuit board 2 through solder bumps 3 aligned and mounted onto landing pads 4. The assembly is adhesively bonded through thermoplastic adhesive joints 5. Each of adhesive joint 5 has the following dimensions in any cross section cut bisecting the thermoplastic adhesive joint and the solder array:

1. an x dimension at the connecting substrate 2/joint interface defined as the longest distance between the ends of the thermoplastic adhesive; and
2. an x' dimension at the printed circuit board 3/joint interface defined as the longest distance between the ends of the thermoplastic adhesive; and
3. a y girth dimension defined as the diameter of the joint measured at ½ the distance of the assembly gap 6.

In this embodiment, a preferred adhesive joint has the dimensions defined by each of the following relationships:

$$3x \geq g \geq 0.33x \text{ and } 3x' \geq g \geq 0.33x'$$

In a more preferred embodiment, the adhesive joint has dimensions defined by each of the following relationships:

$$2x \geq g \geq 0.5x \text{ and } 2x' \geq g \geq 0.5x'$$

For many applications, it is desired to form an adhesive joint satisfying each of the following relationships:

$$x \geq g \geq 0.3x \text{ and } x' \geq g \geq 0.3x' \text{ and}$$

most preferably also satisfies the following relationships:

$$x/x' \geq 0.5 \text{ and } x'/x \geq 0.5$$

Another feature of the invention is the use of a thermoplastic adhesive for rework or repair of faulty surface mount electronic devices or those having broken solder connections. The surface mounted electronic device can be reworked or repaired with ease by mere application of heat. To rework the surface mounted electronic device, the thermoplastic adhesive is heated by global convection or spot heated to a temperature which is sufficiently high to at least sufficiently soften the thermoplastic adhesive and allow one to pull the chip package from the printed circuit board by any known means, such as by the application of a vacuum to the surface of the chip package or by mechanically gripping the chip package. The printed circuit board is optionally pre-heated to prevent any moisture damage. The procedure is preferably performed in the absence of mechanically abrading the adhesive to remove it from the printed circuit board.

More specifically, in a rework or repair operation, one may pre-bake the printed circuit board with global heat to a desired temperature, generally around 80° C. to 150° C.; apply a flux between the surface mounted electronic device and the printed circuit board; fit the surface mounted electronic device into the head of a hot gas tool to locally heat the device to solder melt temperatures, and then gently remove the surface mounted electronic device by a vacuum nozzle preferably mounted on the hot gas head to avoid collapsing the chip onto the board surface and smearing the solder. The site is then cleaned of solder by solder wick or solder vacuum tools to create a uniform surface on the landing pads. The thermoplastic adhesive remaining on the printed circuit board may be left on the board, or vacuumed off in its melt state, or pulled off without mechanical abrasion. To attach a new surface mount electronic device, the board is reheated to the similar pre-bake temperatures; solder paste or a no-clean flux is applied to the landing pads on the board and optionally to the solder bumps; and the surface mount electronic device having thermoplastic adhesive pre-applied, or applied by the technician on site to the bottom surface of the connecting substrate, is mounted onto the landing pads; and the assembly is subjected to solder reflow conditions using global or local hot air directed at the edges and into the gap.

The thermoplastic adhesive used in the process of the invention offers certain advantages to rework and repair operations over thermosetting underfills. First, the application of solder reflow temperatures to melt the solder connections will simultaneously soften or melt the thermoplastic adhesive. By softening or melting the thermoplastic adhesive, the surface mounted electronic device is easily removed by vacuum or light mechanical gripping without risking breakage to the surface mounted electronic device. By contrast, reworking a chip package underfilled with a thermoset adhesive is substantially more difficult because the adhesive does not generally melt below the solder reflow temperature, resulting in having to grip the chip package mechanically to shear the chip package from the printed circuit board along the adhesive bond. This shearing or pulling action may result in damaging the chip package, especially those that are thin or where the printed circuit board is flexible.

Second, the thermoplastic adhesive is easy to remove from the surfaces of the printed circuit board or surface mounted electronic device surfaces, or alternatively, it does not need to be removed at all. Third, the thermoplastic adhesive retains its function as an adhesive after repeated melt/cooling cycles. Thermosetting underfills, however, either do not melt at solder reflow temperatures or are not capable of retaining their functionality as an adhesive if remelted, or both. Therefore, most thermoset adhesives remaining on the printed circuit board must be removed since they are not reworkable, and the removal is by mechanical abrasion such as by scraping or high speed brushing. The thermoplastic adhesive, however, may be cleaned from the printed circuit board by melt and vacuum or by pulling off the board as a solid rather than scraping or abrading. Alternatively, the thermoplastic adhesive may be left in place on the printed circuit board or the surface mounted electronic device since its adhesive functionality and viscosity properties remain intact. The new or repaired surface mounted electronic device may be re-attached using the original thermoplastic adhesive left in place. The thermoplastic adhesive does not need to be postbaked, and can be subjected to repeated heating cycles without destroying its reworkability.

In one embodiment, there is provided a process wherein a first surface mounted electronic device, with a thermoplastic adhesive surface bonded to its connecting substrate in a first configuration, is removed from a printed circuit board to which it was solder bonded, at least a portion of used thermoplastic adhesive remaining on the printed circuit board after removal of the first surface mounted electronic device is left on the printed circuit board as a remaining thermoplastic adhesive, and said surface mounted electronic device, or a replacement surface mounted electronic device, having a thermoplastic adhesive applied to its connecting substrate in a second configuration, which is different from the first configuration and which does not overlay on top of used thermoplastic adhesive remaining on the connecting substrate if any, is mounted and solder bonded to the printed circuit board. Preferably, at least 50 volume % of the remaining adhesive is left on the printed circuit board, and more preferably none of the thermoplastic adhesive is removed from the printed circuit board prior to mounting and solder bonding the second surface mounted electronic device. The technician may use a replacement surface mounted electronic device containing fresh thermoplastic adhesive in a second configuration.

Alternatively, the technician may use the same surface mounted electronic device removed from the printed circuit board, apply fresh thermoplastic adhesive in a second configuration, leave the used thermoplastic adhesive on the connecting substrate or remove it, and mount the surface mounted electronic device onto the printed circuit board and apply solder reflow conditions. Since the location of the fresh thermoplastic adhesive on the connecting substrate is not overlaying on top of the used thermoplastic adhesive remaining on the printed circuit board or on the connecting substrate, the risk of leaving a gap between the solder balls and the landing pads on the printed circuit board caused by overlaying the thermoplastic adhesive is avoided.

Figure 12:
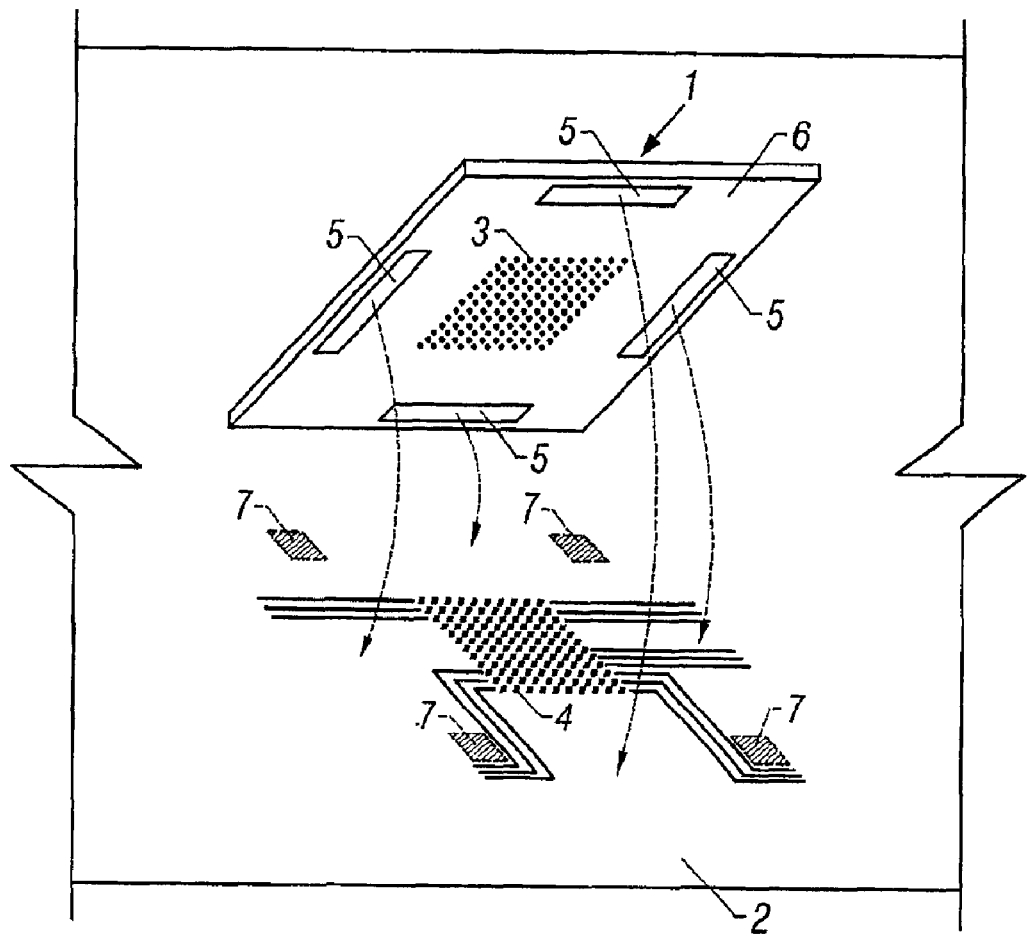
FIG. 12 is a top view of a surface mounted electronic device containing thermoplastic adhesive being mounted onto the landing pads of a printed circuit board.

FIG. 12 is a top view depicting a replacement BGA being mounted, prior to solder reflow, onto a printed circuit board having used thermoplastic adhesive remaining on its surface. Replacement BGA 1 is mounted onto a printed circuit board 2 by aligning the BGA solder balls 3 with the landing pads 4 on the printed circuit board 2. The fresh thermoplastic adhesive 5 is on-site applied to or pre-applied to, and preferably pre-applied, to the bottom surface of the connecting substrate 6 in a configuration which is different from the used thermoplastic adhesive 7 left on the printed circuit board 2 after removal of the defective BGA. Since the thermoplastic adhesive 5 is centered along all four edges of the BGA perimeter, and the used adhesive 7 was applied on the four corners of the defective BGA, the used thermoplastic adhesive 7 does not need to be removed from the printed circuit board and reliable solder ball connections can be had because no overlay of thermoplastic adhesive is possible. In this embodiment, the step of removing the used thermoplastic adhesive 7 can be completely avoided if desired.

Instead of pre-applying the thermoplastic adhesive to the surface mounted electronic device at the time of manufacture, the thermoplastic adhesive may be individually pre-applied by the technician conducting the rework on site. A wide variety of techniques are possible. An example of one technique is to apply the thermoplastic adhesive to the replacement surface mount electronic device in liquid form dispensed through a hot melt gun. Alternatively, to ensure consistent reliability, pieces of a solid thermoplastic adhesive may be softened under convective or forced air heat and applied to an available surface of the surface mount electronic device, preferably at a location which is different than the location of used thermoplastic adhesive remaining on the printed circuit board. The technician may also apply a pre-formed thermoplastic adhesive in the shape of a square or rectangle configured to the shape of the surface mount electronic device perimeter. For example, if the used thermoplastic adhesive remaining on the printed circuit board is located at a position corresponding to the outer perimeter of a connecting substrate of a surface mount electronic device, a preformed thermoplastic adhesive having a shape corresponding to an inner perimeter may be laid onto the connecting substrate of the surface mount electronic device, thereby avoiding overlay.

In another embodiment of the invention, there is provided a process for adhering a printed circuit board comprising contacts, to a surface mount electronic device comprising a connecting substrate having a bottom surface with leads, said process comprising adhering a thermoplastic adhesive onto a portion of said bottom surface, mounting the electronic device onto a printed circuit board to form an assembly in which the leads on said bottom surface are aligned with corresponding contacts on the printed circuit board and the thermoplastic adhesive faces is disposed within said bottom surface and the printed circuit board, followed by heating the assembly under solder reflow conditions effective to provide an adhesive bond between said bottom surface and the printed circuit board, wherein the thermoplastic adhesive comprises a functionalized polyolefin. The amount of the functionalized polyolefin in the thermoplastic adhesive is suitably at least 2% by weight. Other suitable amounts are at least 10 wt. %, at least 20 wt. % and at least 40 wt. %, based on the weight of the thermoplastic adhesive. Preferably, the functionalized polyolefin is functionalized with acid groups, amine groups, or a combination thereof. In the case of an acid functionalized polyolefin, the polyolefin is functionalized with an unsaturated mono- or polycarboxylic acid monomers or derivatives thereof, in an amount ranging from 0.05 wt. % to 50%, based on the weight of the functionalized polyolefin. An acid functionalized polyolefin may be reacted with a polyamine compound to create an amine functionalized or an acid and amine functionalized polyolefin, depending on the stoichiometric ratio of amine to acid groups. Preferably, the thermoplastic adhesive used in the invention is a synthetic polymer.

In another embodiment of the invention, there is provided a process for adhering a printed circuit board comprising contacts, to a surface mount electronic device comprising a connecting substrate having a bottom surface with leads, said process comprising adhering a thermoplastic adhesive onto a portion of said bottom surface, mounting the electronic device onto a printed circuit board to form an assembly in which the leads on said bottom surface are aligned with corresponding contacts on the printed circuit board and the thermoplastic adhesive faces is disposed within said bottom surface and the printed circuit board, followed by heating the assembly under solder reflow conditions effective to provide an adhesive bond between said bottom surface and the printed circuit board, wherein the thermoplastic adhesive comprises a polyamide resin or thermoplastic in an amount of at least 10 wt. %. In a preferred embodiment, the polyamide comprises a functional terminated polyamide comprising an acid or an amine functionality and having a terminal functional group content ranging from 0.04 to 4 meq/g. The thermoplastic adhesive comprising the polyamide compound is a solid or semi-solid at 55° C. The thermoplastic adhesive comprising the polyamide has a complex viscosity of at least 50 Pa s, more preferably 80 Pa s, and most preferably at least 100 Pa s at 220° C. Preferably, the thermoplastic adhesive used in the invention is a synthetic polymer.

In yet another embodiment of the invention, there is provided a process for adhering a printed circuit board comprising contacts, to a surface mount electronic device comprising a connecting substrate having a bottom surface with leads, said process comprising adhering a thermoplastic adhesive onto a portion of said bottom surface, mounting the electronic device onto a printed circuit board to form an assembly in which the leads on said bottom surface are aligned with corresponding contacts on the printed circuit board and the thermoplastic adhesive faces is disposed within said bottom surface and the printed circuit board, followed by heating the assembly under solder reflow conditions effective to provide an adhesive bond between said bottom surface and the printed circuit board, wherein the thermoplastic adhesive comprises:

(A) from 5% to 98% by weight of a functionalized polyolefin, and (B) from 2% to 95% by weight of a polyamide compound, preferably a functional terminated polyamide compound comprising an acid or an amine functionality and having a terminal functional group content of at least 0.04 to 4 meq/g.

If one desires the molecular weight of the thermoplastic adhesive to remain substantially unchanged at high temperatures (e.g. solder reflow temperatures), the type of polyamide compound and functionalized polyolefin selected should be such that these compounds are substantially un-reacted with each other at solder reflow temperatures.

Preferably, the thermoplastic adhesive used in the invention is a synthetic polymer.

In still another embodiment of the invention, there is provided a thermoplastic adhesive composition comprising a blend of:

(A) from 5% to 98% by weight of a functionalized polyolefin, and (B) from 2% to 95% by weight of a polyamide compound, preferably a functionalized polyamide compound.

If one desires the molecular weight of the thermoplastic adhesive to remain substantially unchanged at high temperatures (e.g. solder reflow temperatures), the type of polyamide compound and functionalized polyolefin selected should be such that these compounds are substantially un-reacted with each other at solder reflow temperatures.

Preferably, the thermoplastic adhesive used in the invention is a synthetic polymer.

The functionalized polyolefin used in some of the embodiments of the invention may be manufactured by an conventional copolymerization method or any conventional grafting method. The functionalized polyolefin is advantageous because its olefinic backbone is relatively non-polar and provides excellent adhesion to non-polar low energy surfaces, while its pendant functional groups are more polar and provide adhesion to polar high energy surfaces. Typically, the printed circuit board will be a low energy non-polar surface and many plastic substrates are higher energy more polar substrates. While it is possible that both the connecting substrate and the printed circuit board may be low energy relatively non-polar surfaces, it is more advantageous to use a thermoplastic adhesive that it is sufficiently robust to adhere to any combination of surface types. Accordingly, the same adhesive may be used on a wide variety of printed circuit boards, solder masks, and connecting substrate materials, thereby reducing differentiation among the assembly lines for different products.

The olefinic monomers suitable for manufacturing the functionalized polyolefin in a copolymerization method or a polyolefin used for grafting to a functionalized polyolefin include any of the polymers of alpha-olefins in which the alpha-olefin is a hydrocarbon. Suitable alpha olefins have 2–10 carbon atoms. Especially useful are ethylene and propylene monomers. The functionalized polyolefins or the polyolefin polymers used for grafting include homopolymers, and random or block copolymers. A mix of olefinic monomers for making a random or block polyolefin copolymer or for use in the manufacture of a copolymerized functionalized polyolefin include ethylene with alpha olefins having from 3 to 10 carbon atoms, more preferably from 3 to 6 carbon atoms, most preferably from 3 to 4 carbon atoms. Examples of such alpha-olefins include propylene, 1-butene, 4-methyl pentene-1,1-hexene and 1-octene.

More specific examples of suitable polyolefins useful for grafting include high density polyethylene (HDPE), (i.e., having a density greater than 935 g/cc), low density polyethylene and linear low density polyethylene (i.e., having a density of about 0.915 to 0.935 g/cc, very low density polyethylene (having a density of about 0.870 to about 0.915 g/cc), and ultra-high density polyethylene (having a weight average molecular weight in excess of 1,000,000 and up to 50,000,000), and polypropylene, such as isotactic polypropylene. Among these polyolefins, linear low density polyethylene is preferable because of its moldability, strength, adhesive qualities, and impact resistance.

The functionalized polyolefin used in the invention can be manufactured by any conventional copolymerization or grafting techniques. Suitable functionalized polyolefins are the acid functionalized polyolefins made by functionalizing a polyolefin with mono or polycarboxylic acids having carbon-carbon unsaturation or derivatives thereof, or dicarboxylic acids or the derivatives thereof; amine functionalized polyolefins wherein the polyolefin is functionalized with an amine or derivatives of an amine; and silane functionalized polyolefins wherein the polyolefin is functionalized with an organic silane having a carbon-carbon unsaturation or derivatives thereof. Preferred functionalized polyolefins are the acid and amine functionalized polyolefins, and more preferred are the acid functionalized polyolefins.

Specific examples of suitable carboxylic acid functionalizing agents used as comonomers or in grafting techniques include, but are not limited to, acrylic acid, methacrylic acid, ethylacrylic acid, butylacrylic acid, maleic acid, fumaric acid, tetrahydrophthalic acid, 4-methylcyclohexane-4-en-1, 2-dicarboxylic acid, bicyclo(2,2,1)hepta-5-en-2,3-dicarboxylic acid, itaconic acid, crotonic acid, citraconic acid, isocrotonic acid, mesaconic acid and angelic acid and their derivatives.

The acid derivatives include the acid anhydrides, esters amides, imides, and metal salts. Examples include maleic anhydride, crotonic anhydride, citraconic anhydride, itaconic anhydride, nadic anhydride, nadic methyl anhydride, tetrahydro phthalic anhydride, vinyl acetate, methyl hydrogen maleate, methyl acrylate, methyl methacrylate, ethyl acrylate, ethyl methacrylate, butyl acrylate, butyl methacrylate, glycidyl acrylate, glycidyl methacrylate, monoethyl maleate, diethyl maleate, monomethyl fumarate, dimethyl fumarate, monoethyl itaconate, diethyl itaconate, acrylamide, methacrylamide, maleic monoamide, maleic diamide, maleic N-monoethylamide, maleic N,N-diethylamide, maleic N-monobutylamide, maleic N,N-dibutylamide, fumaric amide, fumaric diamide, fumaric N-monoethylamide, fumaric N,N-diethylamide, fumaric N-monobutylamide, fumaric N,N-dibutylamide, maleimide, N-butylmaleimide, N-phenylmaleimide, sodium acrylate, mono and di-sodium maleate, sodium methacrylate, potassium acrylate, and potassium methacrylate.

One or a combination of two or more of the functionalizing agents may be used.

Random copolymers of ethene or propene and R—CR$^1$CO$_2$H, wherein R is an olefinically unsaturated hydrocarbyl group having from 2 to 10 carbon atoms, and R$^1$ is an alkyl group having from 0 to 6 carbon atoms, are also suitable acid functionalized polyolefins, along with random copolymers of ethene and acrylic acid, methacrylic acid, maleic acid, and/or the anhydrides thereof, and random copolymers of propene and acrylic acid, methacrylic acid, maleic acid, and/or the anhydrides thereof, further optionally copolymerized with carbon monoxide. Preferred acid functionalizing agents include itaconic acid, acrylic acid, methacrylic acid, ethylacrylic acid, butylacrylic acid, maleic acid, and the ester and anhydride derivatives thereof, and vinyl acetate.

In addition, the functionalized polyolefin may be an ionomer e.g. a sodium, zinc or aluminum ionomer of polyolefin functionalized by grafting or copolymerizing with an ethylenically unsaturated di or poly carboxylic acid.

The amine functionalized polyolefin may be prepared by reacting an acid functionalized polyolefin with a suitable polyamine compound, or by copolymerizing (or grafting) a suitable polyamine compound with a polyolefin.

Polyamine compounds are useful for making the polyamide compound. Suitable polyamines include aliphatic, aromatic, and alicyclic amine compounds. A non-limiting example of primary polyamine compounds useful in the practice of the invention is represented by the formula:

wherein n is an average of integers within 0 and 10, inclusive, preferably within 0 and 4 inclusive; and X is a divalent branched or unbranched hydrocarbon radical having about 1–24 carbons, one or more aryl or alkaryl groups, or one or more alicyclic groups, optionally containing oxygen atoms, provided that the primary polyamine compounds have a total of from 2–18 carbon atoms. Preferably, X is a lower alkylene radical having 1–10, preferably 2–6, carbon atoms.

Examples of polyamines include aliphatic polyamines such as mono or polymethylene polyamines, mono or polyethylene polyamines, mono or polybutylene polyamines, mono or polypropylene polyamines, mono or pentylene polyamines, hexylene polyamines, heptylene polyamines, and more specifically trimethylenediamine, tetramethylenediamine, pentamethylenediamine, hexamethylenediamine, 2,2,4-trimethylhexamethylenediamine, 2,4,4-trimethylhexamethylenediamine, octamethylenediamine, ethylene diamine, 4,9-dioxadiamino-1,12-dodecane; triethylene tetramine, tris(2-aminoethyl)-amine, 1,2- and 1,3-propylene diamine, 1,2- and 1,4-butanediamine, 2-methyl-1,5-pentanediamine, decamethylene diamine, diethylene triamine, di(heptamethylene)triamine, tripropylene tetramine, tetraethylene pentamine, pentaethylene hexamine, and di(trimethylene)triamine, and mixtures thereof. Also included are the aromatic diamines such as a phenylenediamine, p- and m-xylylene diamine, methylene dianiline, 2,4-toluenediamine, 2,6-toluenediamine, 2,3-diaminonapthalene, polymethylene polyphenylpolyamine, 4,4'-diaminodiphenyl ether, and isophoronediamine. Examples of the alicyclic polyamines include diaminocyclohexane, piperazine, aminoalkyl-substituted piperazines, 1,3-bis(aminomethyl)cyclohexane, 4,4'diaminodicyclohexylmethane, and bis(4-amino-3-methylcyclohexyl)methane, and mixtures of two, three, or more thereof. Also included are mixtures of aliphatic, alicyclic, and aromatic polyamines. Any of the mentioned primary polyamine compounds can be used singly or in mixture with other primary polyamine compounds. It is possible to use the amine in a wholly or partly neutralized form, i.e. as a salt of an acid. One or more amines can be used in combination. Additionally, the amine component can be a reagent which produces an amine of the type described above upon further chemical reaction such as hydrolysis. For example, imine reagents which produce amines upon contact with water can also be used to prepare the amine functionalized polyolefin.

The amount of the functionalizing agent in the functionalized polyolefin is sufficient to provide suitable adhesion to the connecting substrate and the printed circuit board. In general, the amount of functionalizing agent in the functionalized polyolefin is at least 0.05 wt. % to provide satisfactory adhesion to a polar substrate, such as the polyimide. Suitable ranges of functionalizing agent include an amount within a range of 1–25 wt. %, or 2 to 15 wt. %, based on the weight of the functionalized polyolefin. The maximum amount used is not particularly limited, but the cost of using more functionalizing agent should be weighed against the necessity for obtaining further improvements in adhesion. If two different types of thermoplastic adhesives are used in combination, consideration should be given to ensure their compatibility to each other.

The number average molecular weight of the functionalized polyolefin is not particularly limited. However, when the adhesive composition is used in the application of the invention, consideration to molecular weight should be given to ensure that the thermoplastic adhesive composition exhibits suitable melt temperatures above 120° C. and softens below the solder reflow temperature. Typical number average molecular weights of functionalized polyolefins suitable for adhering printed circuit boards to surface mount electronic devices range from 500 to 500,000, as determined by gel permeation chromatography. In one embodiment, the crystalline melting point of the functionalized polyolefin ranges from 80° C. to about 200° C., as measured by DSC, or, if the polyolefin does not possess a crystalline melting point, its glass transition temperature is about −100° C. to about 20° C., as measured by DSC.

Commercially available functionalized polyolefins are available from E. I. du Pont de Nemours and Company under the trade names of Sclair™, Elvax™, Nucrel™, and Surlyn™, and from Dow Chemical Co. as Primacore™ polymers. Specific examples of functionalized polyolefins include random poly(ethylene-methacrylic acid) copolymers having methacrylic acid contents ranging from 4 wt % to 13 wt. % and a melt flow indexes ranging from 1.5 to 1000 commercially available from Du Pont as the Nucrel™ copolymer series, the poly(ethylene-acrylic acid-carbon monoxide) polymers commercially available from Du Pont as the Elvaloy™ copolymer series, and poly(ethylene-acrylic acid) copolymers having an acrylic acid content of about 3 wt. % up to 20.5 wt. % and a melt flow indexes ranging from 1.5 up to 1300, commercially available from Dow Chemical Co. as the Primacore™ polymer series.

Some of the embodiments of the invention also encompass a process using a thermoplastic adhesive, as well as a thermoplastic adhesive composition, wherein the thermoplastic adhesive comprises a polyamide compound, preferably a functionalized polyamide compound. In one embodiment, the adhesive composition used in the process of the invention comprises a blend of the functionalized polyolefin and the polyamide compound, or a functionalized polyolefin and a functionalized polyamide polymer. It is more preferred that the functional group terminating the polyamide polymer is one or more of a carboxylic acid derived functionality or an amine functionality.

The number average molecular weight of the polyamide compound can be adjusted to produce the desired rheology. A high Mn of the polyamide compounds is suitable to increase the complex viscosity of the adhesive and prevent the adhesive from overflowing or underfilling the gap during solder reflow. The Mn can be adjusted to provide an adhesive with suitable sag or no sag, depending on whether or not the solid thermoplastic adhesive height is sized to allow for a gap. The polyamide compound can be used as a viscosity modifier for a functionalized polyolefin by decreasing its complex viscosity and increase the flow of the thermoplastic adhesive over that of a functionalized polyolefin used alone.

Suitable polyamide compounds are formed by the condensation polymerization of an aliphatic polycarboxylic acid (having 2 or more carboxylic acid groups) having 4–36 carbon atoms with an aliphatic primary polyamine (one which has 2 or more primary or secondary amino groups) having 2–36 carbon atoms, or may be derived from an amino-carboxylic acid, and if desired, also with a diamine and/or a dicarboxylic acid; or formed from a lactam. A copolyamide can also be employed as the polyamide. Any of the well known techniques for manufacturing polyamides are suitable.

Functional termination is obtained by reacting a large excess of one monomer unit until the reaction has proceeded to substantial completion. If an amine terminated polyamide is desired, a stoichiometric excess of amine monomer is used in the reaction vessel, and the reaction proceeds until the desired amine value is obtained, after which excess amine and water are removed by evaporation or other suitable and well known methods. Suitable molar ratios of amine monomer compounds to acid compound monomers are greater 1.1:1, more preferably greater than 1.4:1, most preferably 2:1 or greater. The upper range on the amount of amine monomers can be used to control the molecular weight build up of the polyamide resin. Alternatively, an excess of amine monomer may be added stepwise as the reaction proceeds to near completion. If an acid terminated polyamide is desired, a stoichiometric excess of acid monomer is used in the reaction vessel, and the reaction proceeds until the desired acid value is obtained, after which excess acid and water are removed by evaporation or other suitable and well known methods. Moreover, amine or acid functionality may be added to a propagating polyamide molecule or a finished polyamide molecule by reacting additional polyacid or polyamine, which may be the same or different from the polyacid or polyamine used to make the polyamide molecule, towards the end or at the conclusion of the propagated polymer, or before or after the water of condensation has been removed.

In one embodiment, the functional terminated polyamide has a terminal functional group content in the range of from 0.04 to 4 meq/g. Terminal functional (e.g. amino and carboxylic acid) group contents in this range provide good compatibility with the functionalized polyolefin and provide suitable viscosity to the thermoplastic adhesive. Polycarboxylic acids and polyamines include di-, tri-, tetra-, and higher functional acid or amine groups. Suitable polycarboxylic acids used to provide terminal functionality to the polyamide polymer include any of the polycarboxylic acids used in the condensation reaction between the polyamine monomer and the polycarboxylic acid compound used to make the polyamide. In one embodiment, polycarboxylic acid compounds can be represented by the general formula:

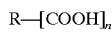

R—[COOH]$_n$ wherein R represents a multivalent aliphatic group, alicyclic group or aromatic group, which may optionally be substituted, and n represents a nominal real number of 2 or more, or its acid anhydride. By nominal is meant the desired rather than actual number of carboxylic acid. Actual analytical measurements may reveal compositions having a measured n value of less than 2.0, such as 1.9. These compositions are within the scope of useful polycarboxylic acids.

Examples of dicarboxylic acids include saturated aliphatic dicarboxylic acids such as glutaric acid, 1,6-hexanedioic acid (adipic acid), 1,7-heptanedioic acid (pimelic acid), 1,8-octanedioic acid (suberic acid), 1,9-nonanedioic acid (azelaic acid), 1,10-decanedioic acid (sebacic acid), 1,12-dodecanedioic acid, and 1,18-octadecanedioic acid; aromatic dicarboxylic acids such as phthalic acid, phthalic anhydride, isophthalic acid and terephthalic acid, tetrahydrophthalic acid, hexahydrophthalic acid, norbornene dicarboxylic acid, naphthalene-1, 4-, -1,5-, -2,6- and -2,7-dicarboxylic acids, diphenic acid and diphenyl ether 4,4'-dicarboxylic acid, 4-methylphthalic acid, 4-t-butylphthalic acid, 3-methylphthalic acid, 4,5-dimethylphthalic acid, 4-isopropylphthalic acid, 4-nitrophthalic acid, tetrachlorophthalic anhydride; alicyclic dicarboxylic acids such as cyclohexane-1,4-dicarboxylic acid, cyclohexane-1,3-dicarboxylic acid; dimerized fatty acids, such as those made by oligomerizing fatty acids, for example, a naturally-occurred or synthetic basic unsaturated fatty acid having 8 to 24 carbon atoms, including the dimers of linolenic acid; and unsaturated aliphatic acids such as acrylic acid, methacrylic acid, ethylacrylic acid, butylacrylic acid, fumaric acid, maleic acid, succinic acid, itaconic acid, crotonic acid, isocrotonic acid, mesaconic acid, citraconic acid, angelic acid, and a-methylene glutaric acid; and the anhydrides of each of the aforementioned acids.

Examples of alpha,omega aminocarboxylic acids are amino octanoic acid, amino decanoic acid, amino undecanoic acid and amino dodecanoic acid.

Preferred polycarboxylic acids are dicarboxylic acids, and more preferred are the dicarboxylic acids having from 4 to 36 carbon atoms, and especially the unsaturated dicarboxylic acids having from 4 to 8 carbon atoms.

Polyamine compounds are useful for making the polyamide compound. Suitable polyamines include aliphatic, aromatic, and alicyclic amine compounds. Non-limiting examples of primary polyamine compounds useful to make the polyamides include any of those used to make an amine functionalized polyolefin as described above, and can be represented by the same general polyamine compound formula.

In addition thereto, other polyamine compound may be used. For example, useful in the manufacture of polyamides are aminocarboxylic acids, which include aminoheptanoic acid, aminononanoic acid, aminoundecanoic acid, etc. These aminocarboxylic acids may also be used independently or in association.

Also useful in making polyamides are lactam monomers. Suitable lactams are butyrolactam, pivalolactam, caprolactam, capryllactam, enanthlactom, undecanolactam and dodecalactom. These lactams may be used independently or in combination.

It is desirable, but not necessary, to select a polyamide which will increase the melting point of the thermoplastic adhesive over that of a thermoplastic adhesive containing only the functionalized polyolefin if used in combination with a functionalized polyolefin. Increasing the melt point of an adhesive containing only a functionalized polyolefin is desirable in order to provide improved high temperature flow control and to prevent the thermoplastic adhesive from becoming tacky at low temperatures (e.g. <100° C.).

In one embodiment, when used in combination with a functionalized polyolefin, the melting point of the polyamide is preferably at least 10° C. higher than the melting point of the functionalized polyolefin. More preferably, the melting point of the polyamide is at least 20° C. higher than the melting point of the functionalized polyolefin. In another embodiment, the melting point of the polyamide is at least 140° C., more preferably at least 150° C., and not more than 210° C., most preferably not more than 190° C.

In another embodiment, there is provided a thermoplastic adhesive comprising a blend of a polyamide compound and a functionalized polyolefin, wherein the polyamide is compatible with the functionalized polyolefin. Preferably, the polyamide compound does not contain a significant number of groups which react or crosslink with the functionalized polyolefin as this will interfere with the melt flow properties of the adhesive. In this embodiment, for example, if the functional groups on the functionalized polyolefin are amine groups, the polyamide is terminated with groups which do not react with the amine groups on the functionalized polyolefin, and desirably the polyamide is amine terminated. In another example, if the functional groups on the functionalized polyolefin are acid groups, then it is preferred that the polyamide compound is also terminated with acid groups rather than amine groups to avoid reacting the functionalized polyolefin with the polyamide compound, thereby retaining the thermoplastic characteristic of the adhesive while providing suitable melt flow characteristics.

In another embodiment, it is desirable to select a polyamide compound which will lower the complex viscosity of the thermoplastic adhesive at solder reflow temperatures when a blend with a functionalized polyolefin is used. The complex viscosity of some functionalized polyolefin compounds are too high at temperatures above 120° C. through temperatures approaching solder reflow temperatures. It is difficult to form an adhesive bond using some of the functionalized polyolefins because some molten functionalized polyolefins having good adhesive strength to the printed circuit board and the connecting substrate do not flow at solder reflow temperatures sufficiently to form an adhesive bridge across the gap. A polyamide compound can be selected in an amount sufficient to adjust the properties of the thermoplastic adhesive which, when molten at solder reflow temperatures, sags sufficiently to flow across the gap onto the printed circuit board without spreading and impinging on the solder terminals.

A suitable polyamide complex viscosity at 190° C. ranges from 2000 cps to 12,000 cps, more preferably from 2000 cps to 10,000 cps, although a polyamide having a complex viscosity outside of these ranges may be used since the molecular weight, functionalization, and amount of the functionalized polyolefin and the polyamide compound may be adjusted to provide a suitable adhesive composition.

The molecular weight of the polyamide is suitably in a range which yield the desired flow characteristics for the thermoplastic adhesive. The Mn of the polyamide, if used as a viscosity modifier, should be low, but if the polyamide is used in excess of 50 wt. % in a blend, its Mn should be adjusted upward to provide sufficiently high viscosity and prevent underfill, overflow, or run-off at melt points below the peak solder reflow temperature. Examples of suitable Mn for polyamides used as viscosity modifiers range from at least 500, preferably 2000 or more, and up to about 8000, more preferably up to about 4000. As the amount of the polyamide increases, such as when used alone or as a major ingredient in a blend, the number average molecular weight should begin to increase from about 5000 up to 100,000, and generally from about 5,000 to about 40,000. The particular polyamide selected, however, is one which produces at the desired complex viscosity, adhesion, melting point, softening point in the proportions used. It is desirable that it should, in the proportions used, also be processable in a melt to extrude into a free standing film.

Suitable polyamide compounds are commercially available under various trade names, including the resins under Macromelt™ 6264 and 6206 available from Henkel Corp.; various Azamide™ resins commercially available from Resolution Performance Products LLC, such as Azamide® 2233, Azamide® 2237, Azamide®2240, Azamide® 2243, Azamide® 2246, Azamide® 2246LV, Azamide® 2462, and Azamide® 2261; and the Unirez™ 2624 and 2642 resins available from Union Camp Corp. of Jacksonville, Fla; and the Platamid and Platatherm polyamide resins available from Atofina.

The weight ratio of the functionalized polyolefin/polyamide blend is not particularly limited so long as the thermoplastic adhesive composition possesses the desired characteristics. Suitable weight ratios of functionalized polyolefin/polyamide range from 98:2 wt. % to 5:95 wt. %, more preferably from 98:2 to 40:60 wt. % respectively.

The blend of functionalized polyolefin/polyamide can be obtained by mixing the functionalized polyolefin and the polyamide compound in melt blending operation using an extruder, kneader, Banbury mixer, roll mill or the like. Suitable melt temperatures range from about 120° C. to 240° C., preferably below 200° C., though the temperature varies depending on the viscosity of the compounds used and whether or not crosslinking reactions are to be avoided. When the melt mixing is carried out at a relatively high temperature (e.g., 200° to 240° C.), the time at melt should be kept short to avoid significant molecular weight build up by crosslinking reactions.

The solid thermoplastic adhesive can be formed into any desired shape by any conventional process. Suitable processes include injection molding, insert injection molding, vacuum molding, simple extrusion into a sheet through a suitable die such as a T-die, pressure molding and thermoforming processes, stamp molding, compression molding processes, and hollow molding processes.

Any other materials which function as thermoplastic adhesives are suitable for use in the process of the invention. As alternatives to the functionalized polyolefin or the polyamide compound, or in addition thereto, other suitable thermoplastic polymers which can be used include acrylonitrile-butadiene copolymer (NBR), acrylonitrile-butadiene rubber-styrene resin (ABS), styrene-butadiene-ethylene resin (SEBS), acrylic resin, polyvinyl butyral, DAP (diallylphthalate), DATP (diallylterephthalate), EVOH (ethylene vinylalcohol copolymer), HDPE (high density polyethylene), HIPS (high-impact polystyrene), LCP (liquid crystal polymer), LDPE (low density polyethylene), PAEK (polyallyl ether ketone), PAN (polyacrylonitrile), PAR (polyacrylate), PAS (polyallylene sulfide), PASF (polyallyl sulfone), PBT (polybutylene terephthalate), PC (polycarbonate), PCT (poly-1,4-cyclohexane dimethylene terephthalate), PEEK (polyether ether ketone), PEI (polyether imide), PEK (polyether ketone), PEN (polyethylene naphthalate), PES (polyether sulfone), polyamideimides, polyimides, PET (polyethylene terephthalate), PKS (polyketone sulfide), PMMA (polymethyl methacrylate), PMP (polymethyl pentene), polyacetal, PP (polypropylene), PPE (polyphenylene ether), PPO (polyphenylene oxide), PPS (polyphenylene sulfide), PS (polystyrene), PSF (polysulfone), polysulfides, PUR (polyurethane), PVA (polyvinyl alcohol), PVC (polyvinyl chloride), PO (phenoxy) resin, other polyesters, and copolymers of with butadiene, optionally also functionalized with a carboxyl group-containing polymerizable monomer such as acrylic acid or maleic acid.

Any other additives which do not degrade the adhesive strength beyond the point of unsatisfactory performance can be added to enhance the oxidative and thermal stability of the thermoplastic adhesive, as well as uv stabilizers, dyes and pigments, fibers and fillers, flame retardants, and plasticizers.

Oxidative and thermal stabilizers include those used in addition to polymers generally. They include, for example, metal halides such as sodium, potassium, lithium and cuprous halides, hindered phenols, hydroquinones, and varieties of substituted members of those groups and combinations thereof.

Ultraviolet light stabilizers include various substituted resorcinols, salicylates, benzotriazoles, benzophenones, and the like. Organic dyes such as nigrosine, and pigments such as titanium dioxide, cadmium sulfide, cadmium sulfide selenide, phthalocyanines, ultramarine blue, carbon black, can be added. Fibers and fillers include carbon fibers, glass fibers, amorphous silica, asbestos, calcium silicate, aluminum silicate, magnesium carbonate, kaolin, chalk, powdered quartz, mica, feldspar, in an amount of up to about 50 wt. % of the thermoplastic adhesive. Plasticizers include dioctyl phthalate, dibenzyl phthalate, butyl benzyl phthalate, hydrocarbon oils, N-normal butyl benzene sulfonamide, ortho and para toluene ethyl sulfonamide.

Suitable flame retardant include a halogen type, phosphorus type or inorganic type flame retardant. The halogen type flame retardant can be generally classified into a bromine type flame retardant and a chlorine type flame retardant. The bromine type flame retardant is high in flame-retarding efficiency as compared with the chlorine type flame retardant, and exhibits a synergistic effect when it is jointly used with antimony trioxide. Preferable example of the chlorine type flame retardant is chlorinated paraffin. A brominated bisphenol A type epoxy resin can be used to lightly crosslink the thermoplastic adhesive and provide sites bound to the thermoplastic adhesive composition.

In addition to the advantages described above with respect to the application of a thermoplastic adhesive to the printed circuit board or the surface mount electronic device over underfill techniques or other techniques using a thermoset adhesive, a further advantage to the thermoplastic adhesive of the invention is that the surface mount electronic device is adhered to the printed circuit board in the absence of a curing step.

The thermoplastic adhesive used in the invention, in addition to all the advantages already noted, also functions to ease thermal stresses due to differing coefficients of thermal expansion between the connecting substrate and the printed circuit board.

The combination of adhesive strength, low modulus, and relatively high elongation makes the thermoplastic adhesive of the invention particularly well suited for adhering surface mount electronic devices to printed circuit boards, especially where the gap between the two is extremely small, the boards are flexible, and/or the applications are subject to jarring and drop.

The adhesive bond strength of the thermoplastic adhesive is measured in a mandrel bend test, which is considered a more rigorous test than a peel strength test. A major cause of delamination is the bend of the printed circuit board during and immediately after a drop. In the mandrel bend test, a test vehicle, which is a surface mount electronic device or a glass slide, is mounted on the desired printed circuit board. The copper cladding on the printed circuit board is wiped with acetone. The adhesive is placed on the copper cladding, and either a 0.25"×0.25" glass chip, or the surface mount electronic device intended for actual use, is mounted on top of the adhesive as the test vehicle. The shape of the adhesive and the location of adhesion is specified, and can range from a uniformly scattered powder, to strips corresponding to the perimeter of two or more edges, to rods, and the like. For example, the adhesive may be cut into strips approximately 0.010" thick, and run the approximate length of the test vehicle along the perimeter of two parallel edges. The adhesive is heated by two 900 watt heat lamps at a distance of 11.5 cm from the heat source for a period of 250 seconds or until such time as the temperature of the adhesive reaches about 180° C. At that temperature, the printed circuit board is brought within 4 cm from the heat lamp and heated for 45 seconds in order to bring the temperature to of the adhesive to 260° C. The sample is then allowed to cool to room temperature. Once cooled, the printed circuit board is bent across various mandrels having radii ranging from 5.5", 4.125", 3", 1.5", and 0.75", in succession. The long dimension of the printed circuit board is perpendicular to the axis of the mandrel. The 0.75" mandrel is the smallest one used in these tests since the printed circuit board itself, rather than the adhesive joint, begins to fail by cracking at this radius. However, smaller radii mandrels can be used if the printed circuit board is sufficiently flexible, depending upon the application.

If delamination has not occurred the largest mandrel, the board is further deflected around successively smaller mandrels until delamination occurs, and the radius of mandrel upon delamination is recorded. The test is conducted at ambient temperatures. The results at each bend radius are recorded as a pass or fail. A fail indicates that the chip delaminated from the printed circuit board at a given radius at either the printed circuit board/adhesive interface, the chip/adhesive interface, or the adhesive itself split. However, breaks or cracks in the chip itself or in the printed circuit board are recorded as passing since this would indicate that the adhesive bond strength exceeded the Youngs modulus of the chip or the board. The relative strength of the adhesive bond can be determined by the degree of deflection at delamination. Delamination is determined visually without the aid of equipment, however, microscopes or the use of X-rays can be used if desired.

In one embodiment of the invention, the surface mounted electronic device remains bonded to the printed circuit board when deflected around a 1.5" mandrel, preferably around a 0.75" mandrel, without delamination.

A further advantage of using a thermoplastic adhesive is that its shock absorbing function resists the impact forces, flexes, and vibrations seen on drops. These forces are reproduced in a gravity drop test. In a gravity drop test, the printed circuit board is weighted for its intended application and dropped in a free fall from a height of 2 meters onto a concrete pad. The printed circuit board is oriented to drop onto the concrete pad on its flat face opposite the chip side face. A series of 100 surface mounted electronic device mounted on multiple printed circuit boards are dropped. The printed circuit boards are repeatedly dropped until 50% of the surface mounted electronic devices measured a circuit failure. The data is recorded as number of drops to failure for 50% of the surface mounted electronic device and the number of drops to failure of 100% of the surface mounted electronic devices.

In one embodiment comprising an assembly of a printed circuit board adhered to a surface mounted electronic device by a thermoplastic adhesive and solder bonded thereto, 50% of the surface mounted electronic device exhibit a circuit failure at 15 or more drops, preferably 30 or more drops, more preferably 40 or more drops, and most preferably 50 or more drops. Advantageously, 100% of the surface mounted electronic devices exhibit circuit failure at 80 or more drops, more preferably at 100 or more drops, and most preferably do not exhibit any increase in drop failure between the number of drops at 50% failure and 100 drops.

The thermoplastic adhesive of the invention is a solid or semi-solid at 55° C., preferably a solid or semi-solid at 80° C., more preferably a solid or semi-solid at 100° C., and most preferably a solid or semi-solid at 110° C. It is desirable to ensure that the thermoplastic adhesive remains a solid under anticipated temperatures for the ultimate application so that the thermoplastic adhesive does not flow and break the adhesive joint.

The complex viscosity of the thermoplastic adhesive is measured using Parallel Plate Rheometry ("PPR"). The PPR test is used to provide data concerning the softening point of the thermoplastic adhesive, the point of its minimum viscosity, how the melt viscosity or modulus changes with a rise in temperature, and its thickening profile as it is cooled to its solidification point. Given that the solder reflow cycle will hold the temperature of the assembly beyond the melt point of the thermoplastic adhesive for an extended period of time, this test provides useful data to the formulator to ensure that the thermoplastic adhesive does not, during the solder reflow cycle, overflow or run off the board yet flow sufficiently under the force of gravity to sag, thereby providing a thermoplastic adhesive joint upon cooling.

In PPR, the thermoplastic adhesive sample is placed between two parallel circular plates ground to exact tolerances. While isothermal test methods are available, the test method used in the invention provided for a steady programmed heat up ramp. The plates are contained within a programmable oven, and a heating profile is programmed into the instrument as well as the strain and frequency. The test sample is placed between the two plates. The bottom plate oscillates to the programmed strain and frequency. Energy is transmitted through the thermoplastic adhesive sample to the upper plate which is attached to a transducer.

When comparing the strain to the original input value, the instrument determines the viscosity by measuring the out of phase components determining the phase angle or tan delta. The instrument then calculates the storage and loss modulus as well as the complex viscosity. This test provides a measurement of viscosity (Eta*), and two components of complex modulus—the stiffness or storage (G') and the dampening or loss (G") components.

The thermoplastic adhesive preferably has a storage modulus (G')of at least 100 Pa at temperatures of up to 125° C. More preferably, the storage modulus is at least 1000 at temperatures of up to 125° C.

The thermoplastic adhesive preferably has a complex viscosity of at least 50 Pa·s, more preferably 80 Pa·s, and most preferably at least 100 Pa·s, and even at least 175 Pa·s, at any temperature ranging from 140° C. and 220° C., inclusive, when measured at a shear rate of 0.1 radians per second and a 1 mm gap between 1" plates, at a heat up rate of 2° C. per minute starting at 140° C. The thermoplastic adhesive preferably has a complex viscosity which does not exceed 10,000 Pa·s, more preferably 5000 Pa·s, and most preferably 2500 Pa·s at 220° C.

In embodiments where the thermoplastic adhesive is a blend or where a gap is provided between the thermoplastic adhesive and the printed circuit board, the complex viscosity of the thermoplastic adhesive having a complex viscosity above 10,000 Pa·s at 220° C. indicates that the thermoplastic adhesive will have difficulty sagging sufficiently to form an adhesive joint across the gap. If the complex viscosity is below 50 Pa·s, the thermoplastic adhesive becomes too fluid on melt resulting in the formation of a poor thermoplastic adhesive joint, overflow, or underfill, at peak solder reflow temperatures.

The tensile elongation of the thermoplastic adhesive is measured by ASTM D638 at a crosshead speed of 2" per minute. It is advantageous to use a thermoplastic adhesive which has a tensile elongation of at least 50%, more preferably at least 100, and most preferably at least 200.

The stiffness of the thermoplastic adhesive (temperature independent) is determined by its Youngs modulus, and is measured by ASTM D638. In some embodiments of the invention, the modulus of the thermoplastic adhesive is no more than 2000 MPa at 25° C. The Youngs modulus is suitably within the range of 5 MPa to less than 2000 MPa, more preferably from 5 MPa to 1000 MPa, and most preferably from 70 to 300 MPa.

In another embodiment of the invention, the tensile strength of the thermoplastic adhesive seen as a maximum on a stress strain curve is preferably at least 500 psi. While there is no upper limit to the tensile strength, in most applications a tensile strength will not exceed 15,000 or even 4000. The tensile strength is measured by ASTM D638.

The invention is illustrated by some of the embodiments described above and are not regarded as in any way limiting the scope of the invention.

WORKING EXAMPLES

Films of test adhesives were prepared by placing about 1 gram of adhesive pellets on a TEFLON™ plate resting on top of an aluminum plate preheated in an oven to a temperature of about 200° C. The pellets were allowed to heat for about 1 minute, after which a second TEFLON™ plate was laid on top of the molten pellets, followed by an aluminum plate weighted with a 5 lb copper bar. The assembly was allowed to heat for 10–15 minutes to about 200° C., removed from the oven, clamped into a vise, and squeezed to form a 7 mil thick film. For thicker films in the range of 10–15 mils, 2 grams of the adhesive pellets were placed on the TEFLON™ plates in the oven, and the assembly was pressed with appropriately sized shims. From the cooled sheets, the adhesive strips or squares were cut to size.

FPE 1 is an acid functionalized polyethylene polymer functionalized with 10.5 wt % methacrylic acid having a melt index of 35.

FPE 2 is an acid functionalized polyethylene polymer functionalized with 9 wt % methacrylic acid having a melt index of 3.

FPE 3 is an amine functional polyethylene polymer made by compounding 0.4 wt % 4,9-dioxa-1,12 diaminododecane with 4 wt % methacrylic acid functionalized polyethylene having a melt index of 3.

PA1 is an acid functional thermoplastic polyamide having a viscosity of 80 Poise at 190° C. and a softening point of 160° C.

BLEND 1 is a 50/50 weight ratio of FPE 1 and PA 1

BLEND 2 is a 3:1 weight ratio of FPE 1 and PA 1

Example 1

Thin strips measuring from 0.010" to 0.015" by ¼" long were cut from the FPE 2 and the FPE 3 sheets. The FPE 2 strips were laid along the two parallel edges of a ¼"×¼" glass slide 0.025" thick, and also along two parallel edges on a BGA. With the polyolefin side up, the polyolefins were bonded to the glass slides and the BGA by heating to the first stage of a Thermal Cycle. The Thermal Cycle apparatus used was a ¼" TEFLON™ board mounted on a lift under a Dayton IR lamp equipped with 900 watt lamps. Using temperature probe thermal waxes, the distance to the heat lamp to achieve a temperature of 180° C. was determined, and the time to reach 180° C. was determined to be 255 seconds. Once the test sample was exposed to the heat lamp for 255 seconds, the test sample was heated in a second stage by elevating the lift to a distance from the lamp predetermined to reach 260° C. within 45 seconds.

To bond the FPE 2 to the glass slide and the BGA, only the first stage thermal cycle was engaged such that the FPE 2 adhesive was subjected to 180° C. within 255 seconds, removed from the heat lamps, and allowed to cool to room temperature under ambient conditions. Each of the test samples were mounted directly to the chip sides of 3 different printed circuit boards and subjected to a full Thermal Cycle simulating actual solder reflow conditions. These steps were repeated using the FPE 3 adhesive.

Each of the 6 printed circuit boards were visually inspected for their flow characteristics. In each case, the adhesive flowed on and wetted the printed circuit board sufficiently to form an adhesive joint without underfilling the slide or BGA.

Each of the printed circuit board were subjected to an adhesion test. The adhesive bond strength of the thermoplastic adhesive was measured in a mandrel bend test. The printed circuit board assemblies were bent across various mandrels having radii ranging from 5.5", 4.125", 3" radius, 1.5" radius, and 0.75" radius, in succession. The long dimension of the printed circuit board was perpendicular to the axis of the mandrel. The 0.75" mandrel is the smallest one used in these tests since the printed circuit board itself, rather than the adhesive joint, begins to fail by cracking at this radius.

All 3 glass slides and all 3 BGA's containing the FPE 2 and FPE 3 adhesives passed the mandrel tests, meaning that the test vehicles remained bonded to the printed circuit boards without any indication of failure or partial delamination across any of the mandrels.

Example 2

FPE 2 adhesive was cut into ¼" strips having a thickness of about 0.024", laid up along two parallel edges on a glass test slide measuring ¼"×¼"×0.040", and heat bonded to the slide by subjecting the slide, adhesive side up, to a first stage in a Thermal Cycle (ambient to 180° C. over 255 seconds.). Once cooled, the glass slide was inverted, and mounted on top of a glass spacer sitting on the chip side of a printed circuit board wiped clean with acetone. The glass spacer was thick enough to provide a gap between the adhesive and the printed circuit board. The assembly was Thermally Cycled through both stages. Visual inspection revealed that the adhesive had sagged and flowed sufficiently to form a joint with the printed circuit board.

In the Mandrel bend test, the assembly passed through all deflections down to the 0.75" mandrel.

Example 3

PA 1 adhesive was cut into 1¼" strips having a thickness of about 0.024", laid up along two parallel edges on a glass test slide measuring ¼"×¼"×0.040", and heat bonded to the slide by subjecting the slide, adhesive side up, to a first stage in a Thermal Cycle (ambient to 180° C. over 255 seconds.). Once cooled, the glass slide was inverted, and mounted on top of the chip side of a printed circuit board wiped clean with acetone. The glass spacer was thick enough to provide a gap between the adhesive and the printed circuit board. The assembly was Thermally Cycled through both stages. Visual inspection revealed that the adhesive had bonded to the printed circuit board, but had underfilled the glass slide.

The test vehicle was subjected to the mandrel bend tests to determine adhesive strength. At the 1" mandrel radius, the glass slide broke. However, there was no indication of delamination or adhesive failure.

Example 4

BLEND 1 (10 grams of FPE 1 and 10 grams of PA 1) were formed into a sheet on a TEFLON™ lined hot plate at 200° C., pressed to a thickness of 12 mils (0.012"). The same procedure as used in Example 2 was repeated, except using PA-1 as the thermoplastic adhesive. By visual inspection, it was determined that the viscosity of the thermoplastic adhesive was low due to the flow pattern running along the printed circuit board exhibiting an overflow characteristic having a width on the printed circuit board greater than the width of the joint itself. However, the assembly did pass down to the 0.75" mandrel bend test.

Example 5

BLEND 2 (15 g of FPE 1 and 5 g of PA 1) were formed into a sheet on a teflon lined hot plate at 200° C., pressed to a thickness of 12 mils. The ingredients were compatible as determined by clarity at room temperature. The assembly passed a ¾" mandrel bend test, and the thermoplastic adhesive formed a well defined adhesive joint.

Example 6

BLEND 3 was prepared by combining 125 g of FPE-1 and 125 g of FPE-2 at a 50/50 weight ratio in a resin kettle. The kettle was nitrogen purged, and the ingredients were then heated to 180° C. without agitation. The agitator was hand turned to avoid creep up the shaft of the agitator. The blend was heated to 200° C., and agitated for 10 minutes under 15" of vacuum. The ingredients were poured onto Teflon sheet and cooled. The visual appearance of the sheet indicated very few entrained air bubbles.

BLEND 4 was poured into a sheet in the same manner, except that a 75:25 weight ratio of FPE-1:PA-1 was used. The mixture was more viscous with more air bubbles entrained into the sheet.

Once cooled, each of the sheets were pressed between Teflon lined plates. BLEND 3 was pressed at 350° F. using an 18 Kg weight to 15–20 mils thick, and BLEND-4 was pressed at 400° F. into 15–18 mil thickness using an 18 Kg plate.

The viscosity of each blend was measured by the PPR test described above. The gap between the 1" parallel circular plates was set to 1 mm. The heat up ramp profile was programmed to be 2° C. per minute starting at 140° C. and ending at 240° C. The strain was set to a shear rate of 0.1 radians per second.

Figure 13:
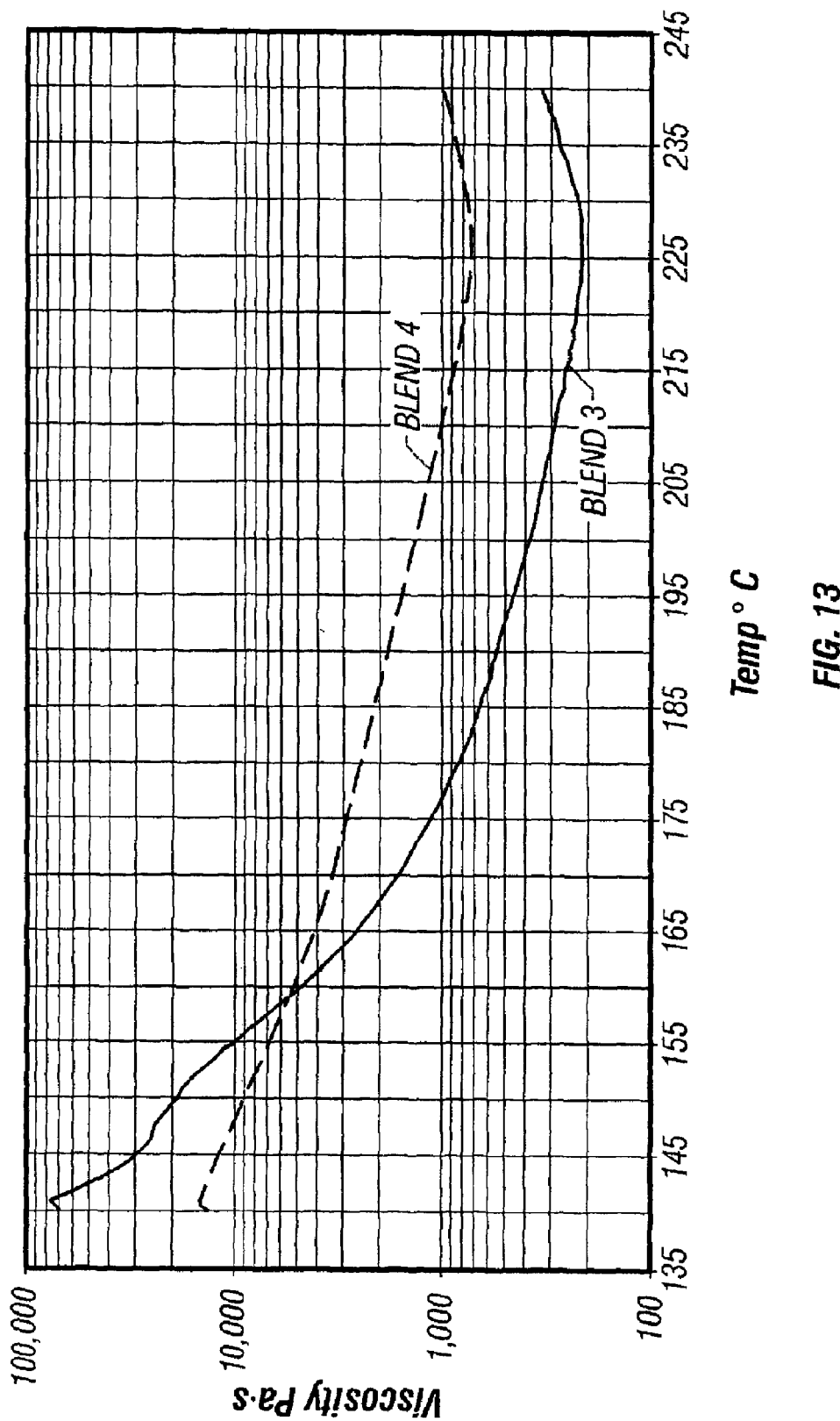
FIG. 13 is a graph plotting the complex viscosity of two thermoplastic adhesive blends as a function of temperature.

The results of the PPR test are set forth in FIG. 13. As can be seen from the viscosity profiles, the 75:25 blend represented by curve BLEND 4 has a viscosity ranging from 750 to 2500 Pa·s at typical solder reflow temperature ranging from of 180° C. and 225° C. Within this viscosity range, the viscosity profile indicates that the thermoplastic adhesive will sag sufficiently under gravity without overflow, especially where the gap size is small (e.g. 7–8 mils). For larger gap sizes (e.g. 10-15 mils) where more flow is desired to traverse the gap, a thermoplastic adhesive having the viscosity profile of curve BLEND 3 is more preferred because at solder reflow temperatures ranging from 180° C. to 225° C., the viscosity dropped within a range of 800 Pa·s to 210 Pa·s, but not below 50 Pa·s. However, both profiles indicate that the adhesives would qualify as good candidates for adhering a surface mount electronic device to a printed circuit board without underfilling or overflowing because the final viscosity did not drop below 50 Pa·s, and even 80 Pa·s at elevated temperatures of 225° C., both softened above 120° C., and the materials were solid at 100° C.

The assemblies each passed the ¾" mandrel bend test indicating good adhesion. The physical properties of BLENDS 3 and 4 were measured. The results indicated that the tensile strength of BLEND 3 was 1049 psi, its maximum elongation was 246%, and its modulus was 13,449 psi. The analysis of BLEND 4 indicated that its tensile strength was 1760.5 psi, its elongation was 508%, and its modulus was 13530 psi. These results indicate that the blends have the properties to absorb an impact by bearing the load within the thermoplastic adhesive rather than transferring the load to the solder joints.

Example 7

A sheet of Blend 3 thermoplastic adhesive was cut into strips ¼" long, about 50 mils wide, and 10 mils thick. The strips were laid at room temperature onto the available surfaces of a polyimide sheet containing numerous tape BGA solder arrays arranged in rows and columns pre-heated to 93° C., then 97° C., and 100° C. The thermoplastic adhesive was successfully tacked onto the polyimide sheet surface at 100° C. without delamination upon rotation through 360° on any axis and upon lightly tapping the board. At 93° C., the strips failed to show tack, and at 97° C., some tack was formed but insufficient to avoid delamination on handling.

What we claim is:

1. An assembly comprising a surface mounted electronic device and a printed circuit board defining an assembly gap width between the device and the printed circuit board before solder reflow, said surface mounted electronic device comprising an organic connecting substrate having terminal leads or solder bumps and having a bottom surface facing the printed circuit board, said bottom surface comprising a semi-solid or solid thermoplastic adhesive attached to a portion of the bottom surface, wherein the terminal leads or solder bumps are mounted on landing pads on the printed circuit board, and the thermoplastic adhesive has a height which is less than the assembly gap width to provide a second gap between the thermoplastic adhesive and the printed circuit board.

2. The assembly of claim 1, wherein the thermoplastic adhesive height is no more than 70% of the assembly gap width.

3. The assembly of claim 1, wherein the printed circuit board is flexible.

4. The assembly of claim 1, wherein the thermoplastic adhesive is electrically non-conducting.

5. The assembly of claim 1, wherein the thermoplastic adhesive is applied as a solid or semi-solid to an available surface on said bottom surface.

6. The assembly of claim 1, wherein the surface mounted electronic device comprises a BGA having an array of solder bumps on said bottom surface of the connecting substrate, and the thermoplastic adhesive is applied as strips spanning the length of at least two perimeter edges on said bottom surface.

7. The assembly of claim 1, wherein the surface mounted electronic device comprises a BGA having an array of solder bumps on said bottom surface of the connecting substrate, and the thermoplastic adhesive is applied on each corner of the bottom surface.

8. The assembly of claim 1, wherein the surface mounted electronic device comprises a BGA having an array of solder bumps on said bottom surface of the connecting substrate, and the thermoplastic adhesive is applied between each of four corners on the bottom surface.

9. The assembly of claim 1, wherein the thermoplastic adhesive is attached to the connecting substrate by application of heat to the thermoplastic adhesive, the connecting substrate, or both, sufficient to render the thermoplastic adhesive tacky.

10. The assembly of claim 1, wherein the thermoplastic adhesive is attached to the connecting substrate by application of heat to the thermoplastic adhesive, the connecting substrate, or both, laying down the thermoplastic adhesive on an available surface of the connecting substrate, followed by applying pressure to the thermoplastic adhesive.

11. The assembly of claim 1, wherein the thermoplastic adhesive is attached to the connecting substrate through a pressure sensitive adhesive by application of pressure to the thermoplastic adhesive.

12. The assembly of claim 1, wherein the thermoplastic adhesive has a tensile strength of at least 500 psi to 4000 psi.

13. The assembly of claim 1, wherein the thermoplastic adhesive has a height which is at least 25% and no more than 90% of the assembly gap width.

14. The assembly of claim 13, wherein the thermoplastic adhesive height is at least 40% of the assembly gap width.

15. The assembly of claim 1, wherein the surface mounted electronic device is a leaded surface mounted electronic device.

16. The assembly of claim 15, wherein the surface mounted electronic device is a PBGA, $\mu$BGA, flip chip BGA, stacked die BGA, or flex tape BGA.

17. The assembly of claim 1, wherein the printed circuit board is a material comprising a polyimide, polyester, polycyclohexylene terephthalates, liquid crystal polymers, polyphenylene sulfide, liquid crystal polymers, polyether sulfone, polyether ether ketone, aramid, polycarbonate or polyarylate, phenolic resin impregnated paper under the FR-2 classification, a epoxy resin impregnated paper under the FR-3 classification, CEM-1, and glass fibers impregnated with epoxy resins under the FR-4 classification.

18. The assembly of claim 17, wherein the printed circuit board is a material comprising a polyimide polymer, or phenolic resin impregnated paper under the FR-2 classification, a epoxy resin impregnated paper under the FR-3 classification, CEM-1, and glass fibers impregnated with epoxy resins under the FR-4 classification, or polycyclohexylene terephthalates.

19. The assembly of claim 1, wherein the thermoplastic adhesive has a complex viscosity of at least 50 Pa·s, and is a solid or semi-solid at 55° C.

20. The assembly of claim 19, wherein the thermoplastic adhesive has a complex viscosity of at least 80 Pa·s, and is a solid at 80° C.

21. The assembly of claim 20, wherein the thermoplastic adhesive is a solid or semi-solid at 100° C.

22. The assembly of claim 1, wherein the thermoplastic adhesive has a storage modulus of at least 100 Pa at temperatures of up to 125° C, as measured in a parallel plate rheometry test at a 1" circular plate gap width of 1 mm, and a heat rate of 2° C. per minute, and a shear rate of 0.1 radians per second.

23. The assembly claim 22, wherein the thermoplastic adhesive has a storage modulus of at least 1000 Pa at temperatures up to 125° C.

24. The assembly of claim 1, wherein the thermoplastic adhesive has a tensile elongation of at least 50%.

25. The assembly of claim 24, wherein the thermoplastic adhesive has a tensile elongation of at least 100%.

26. The assembly of claim 25, wherein the thermoplastic adhesive has a tensile elongation of at least 150%.

27. The assembly of claim 1, wherein the thermoplastic adhesive has a Youngs modulus ranging from 5 MPa to 2000 MPa.

28. The assembly of claim 27, wherein the thermoplastic adhesive has a Youngs modulus ranging from 70 MPa to 300 MPa.

29. The assembly of claim 1, wherein the thermoplastic adhesive comprises
   (A) from 5% to 98% by weight of a functionalized polyolefin, and
   (B) from 2% to 95% by weight of a polyamide compound.

30. The assembly of claim 29, wherein the weight ratio of the functionalized polyolefin to the polyamide compound ranges from 98:2 to 40:60, respectively.

31. The assembly of claim 1, wherein the thermoplastic adhesive comprises a polyamide polymer.

32. The assembly of claim 31, wherein the thermoplastic adhesive comprises a functionalized polyamide polymer.

33. The assembly of claim 31, wherein the polyamide has a complex viscosity ranging from 2000 cps to 12,000 cps at 190° C.

34. The assembly of claim 31, the polyamide has a number average molecular weight Mn within a range of 500 and up to 8000.

35. The assembly of claim 31, wherein the polyamide has a number average molecular weight Mn within a range of 5000 to 100,000.

36. The assembly of claim 1, wherein the thermoplastic adhesive has a complex viscosity of at least 50 Pa·s at any temperature ranging from 140° C. to 220° C., as measured in a parallel plate rheometry test at a 1" circular plate gap width of 1 mm, and a heat rate of 2° C. per minute starting at 140° C., and at a shear rate of 0.1 radians per second.

37. The assembly of claim 36, wherein the thermoplastic adhesive has a complex viscosity which does not exceed 5000 Pa·s at 220° C.

38. The assembly of claim 37, wherein the thermoplastic adhesive has a complex viscosity which does not exceed 2500 Pa·s at 220° C.

39. The assembly of claim 36, wherein the thermoplastic adhesive has a complex viscosity of at least 80 Pa·s at any temperature ranging from 140° C. to 220° C.

40. The assembly of claim 39, wherein the thermoplastic adhesive has a complex viscosity of at least 100 Pa·s at any temperature ranging from 140° C. to 220° C.

41. The assembly of claim 40, wherein the thermoplastic adhesive has a complex viscosity of at least 175 Pa·s at any temperature ranging from 140° C. to 220° C.

42. The assembly of claim 1, wherein the thermoplastic adhesive comprises a functionalized polyolefin.

43. The assembly of claim 42, wherein the functionalized polyolefin comprises an amine functionalized polyolefin.

44. The assembly of claim 42, wherein the amount of the functionalized polyolefin is at least 20 wt. %, based on the weight of the thermoplastic adhesive.

45. The assembly of claim 42, wherein the functionalized polyolefin is functionalized with acid groups, amine groups, or a combination thereof.

46. The assembly of claim 45, wherein the functionalized polyolefin is functionalized with a functionalizing agent comprising unsaturated mono- or polycarboxylic acid monomers or the acid derivatives thereof.

47. The assembly of claim 46, wherein the functionalizing agent comprises itaconic acid, acrylic acid, methacrylic acid, ethylacrylic acid, butylacrylic acid, maleic acid, the ester and anhydride derivatives thereof, or vinyl acetate.

* * * * *